(12) United States Patent
Chiu et al.

(10) Patent No.: US 12,347,711 B2
(45) Date of Patent: Jul. 1, 2025

(54) GAS DIFFUSION DEVICE, AND WAFER CONTAINER INCLUDING THE SAME

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Kuo-Hua Lee, New Taipei (TW); Shu-Hung Lin, New Taipei (TW); Hao-Kang Hsia, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 281 days.

(21) Appl. No.: 17/882,703

(22) Filed: Aug. 8, 2022

(65) Prior Publication Data
US 2023/0054753 A1  Feb. 23, 2023

Related U.S. Application Data

(60) Provisional application No. 63/316,391, filed on Mar. 3, 2022, provisional application No. 63/284,105, filed on Nov. 30, 2021, provisional application No. 63/233,878, filed on Aug. 17, 2021.

(51) Int. Cl.
*H01L 21/673* (2006.01)
(52) U.S. Cl.
CPC .............................. *H01L 21/67389* (2013.01)

(58) Field of Classification Search
CPC .................. H01L 21/67389; H01L 21/67393
See application file for complete search history.

(56) References Cited

U.S. PATENT DOCUMENTS

| | | | |
|---|---|---|---|
| 6,368,411 | B2 | 4/2002 | Roberson, Jr. et al. |
| 6,899,145 | B2 | 5/2005 | Aggarwal |
| 7,235,138 | B2 | 6/2007 | Zheng et al. |
| 9,305,817 | B2 | 4/2016 | Kaise et al. |
| 10,923,373 | B2 * | 2/2021 | Ogawa .............. H01L 21/67379 |
| 2015/0357218 | A1 | 12/2015 | Lin et al. |
| 2016/0118282 | A1 | 4/2016 | Maraschin et al. |
| 2016/0276190 | A1 | 9/2016 | Smith et al. |
| 2017/0213752 | A1 | 7/2017 | Ogawa et al. |
| 2018/0261483 | A1 | 9/2018 | Woo et al. |

(Continued)

FOREIGN PATENT DOCUMENTS

| | | |
|---|---|---|
| EP | 1343202 A1 | 9/2003 |
| EP | 1555689 B1 | 5/2010 |

(Continued)

*Primary Examiner* — Timothy L Maust
(74) *Attorney, Agent, or Firm* — troutman pepper locke; Tim Tingkang Xia, Esq.

(57) ABSTRACT

The present invention provides a wafer container and a gas diffusion device applied in the wafer container. The wafer container includes a shell, and all components included and applied on the shell are made of thermal resistance materials. The gas diffusion device and the wafer container, when assembled together, utilize a coupling structure and a collar as a protection mechanism for the gas diffusion device. The gas diffusion device has a buffering chamber that provides a buffering tolerance and a communicating space for the gas before the gas enters an interior space of the wafer container.

31 Claims, 32 Drawing Sheets

(56) References Cited

U.S. PATENT DOCUMENTS

| | | |
|---|---|---|
| 2018/0374731 A1 | 12/2018 | Woo et al. |
| 2019/0393063 A1 | 12/2019 | Matsutori |
| 2021/0013075 A1 | 1/2021 | Chiu et al. |
| 2021/0280446 A1 | 9/2021 | Fuller et al. |
| 2023/0128154 A1 | 4/2023 | Smith |

FOREIGN PATENT DOCUMENTS

| | | |
|---|---|---|
| EP | 2272088 B1 | 12/2016 |
| JP | 2002170876 A | 6/2002 |
| JP | 3960787 B2 | 8/2007 |
| JP | 5241607 B2 | 7/2013 |
| JP | 2020150245 A | 9/2020 |
| KR | 20060100992 A | 9/2006 |
| KR | 101366135 B1 | 2/2014 |
| KR | 20140055699 A | 5/2014 |
| KR | 20210055483 A | 5/2021 |
| TW | I773536 B | 8/2022 |
| WO | 2009114798 A2 | 9/2009 |
| WO | 2011072260 A2 | 6/2011 |
| WO | 2017040913 A1 | 3/2017 |
| WO | 2018179964 A1 | 10/2018 |
| WO | 2020046867 A1 | 3/2020 |
| WO | 2022269718 A1 | 12/2022 |

\* cited by examiner

GAS DIFFUSION DEVICE, AND WAFER CONTAINER INCLUDING THE SAME

CROSS-REFERENCE TO RELATED APPLICATION(S)

This application claims the benefits of U.S. Provisional Application Ser. No. 63/233,878 and filed on Aug. 17, 2021; and U.S. Provisional Application Ser. No. 63/284,105 and filed on Nov. 30, 2021; and U.S. Provisional Application Ser. No. 63/316,391 and filed on Mar. 3, 2022; all of which are expressly incorporated by reference herein in their entirety.

BACKGROUND OF THE INVENTION

Field of the Invention

The present invention relates to a gas diffusion device, and more particularly, to a gas diffusion device for filling a specific gas and installed in a wafer container, and even more particularly, to a gas tower installed in a wafer container.

Description of the Prior Art

A dry gas or inert gas is generally filled in a wafer container, so as to reduce the humidity within the wafer container to below 10%. During a process of opening the wafer container, a pressure difference causes external air to enter an accommodating space in the container, leading to a sudden rise in the humidity. Moreover, particles may be carried by the external air and then become attached on surfaces of a wafer. Thus, the dry gas or inert gas needs to be persistently filled in the wafer container so as to resist against external air that enter when the container is opened. However, a gas diffuser mounted in the wafer container is limited by an internal area of the wafer container, and the position of a through hole provided for gas filling at the bottom is fixed. Thus, in current gas filling technologies, a gas intake module is provided at the through hole for filling the wafer container with gas and the gas intake module is configured in a non-straight-through manner from the gas inlet through an air outlet path of a porous tube (gas tower). That is, the center axis of the gas intake module is offset from the center axis of the porous tube, so as to achieve of the object of gas filling by this winding structure and to solve the issue of a limited space in the wafer container. Such offset configuration or staggered arrangement policy requires the gas to pass through a winding path from the gas intake module to the porous tube, resulting in an increase of flow time and poor fluency due to the winding during the traveling process of the gas, further incurring a problem of poor purging efficiency. In addition, with an increasing demand of gas diffusion flow, although increasing the size of the porous tube can be a solution, the problem of a limited space of the wafer container is left unsolved. A conventional porous tube (gas tower) is designed as a circular tube that discharges air in a 360-degree manner, and this may cause turbulence in the interior space of the wafer container. Moreover, a porous tube with an increased radial size may interfere with the wafer.

The above offset configuration of the gas intake module and the porous tube further suffer from drawbacks of being difficult to install. On a downstream end of the winding path, that is, the bottom of the porous tube, breaking or damage may easily occur during installation, hence affecting the quality of airflow. A conventional porous tube is made of one single material, and a connecting structure between the porous tube and the gas intake module is susceptible to problems of breaking or poor airtightness during an assembly process, causing particles to become attached to the surface of the wafer. Furthermore, as shown in FIG. 1, a pair of diffuser assemblies are usually arranged in a wafer container (10), and the both the diffuser assemblies have respective gas intake modules (11) and porous tubes (12), wherein each gas intake modules (11) has a check valve (13). A gas filling disk surface (14) can be connected to the gas intake module (11) at the bottom of the wafer container (10) and supply a gas. In case of degraded performance or malfunction of one of the check valves (13), a difference is caused between incoming airflows of the two diffuser assemblies, causing non-uniform airflows entering the interior of the container or an insufficient total flow. In addition, a wafer can be placed in the wafer container (10) in a high-temperature condition during a semiconductor fabrication process, such that the temperature of the interior space of the wafer container (10) also becomes high, which may even undesirably affect performance of components assembled on the wafer container (10).

In view of the above, there is a need for a person skilled in the art to develop an improved gas diffusion device, so as to solve the problems of inconsistent gas filling performance and hence poor airflow quality caused by such conventional non-straight-through structure and fragile structure at the connection of the porous pipe, as well as the problem of degraded performance caused by the internal high temperature of a wafer container.

SUMMARY OF THE INVENTION

It is an object of the present invention to provide a gas diffusion device including: at least one porous tube, having a longitudinal space, the longitudinal space having a closed end and an open end; and at least one collar, connected to the open end, configured to buffer a corresponding coupling structure on a bottom portion of a wafer container to which the porous tube is assembled so as to prevent breaking of the open end.

In one specific embodiment, the shape of a horizontal cross section of the porous tube is an ellipsoid or an elongated narrow shape having a long axis and a short axis, or a circle having a diameter.

In one specific embodiment, the coupling structure at the bottom portion defines a through channel which allows a gas to enter the longitudinal space.

In one specific embodiment, the porous tube or the collar is made of a thermal resistant material which is one or a combination of at least two selected from a group consisting of PEEK, HTPC, FKM, PPS, PPO, chlorinated polyether, POB, TORLON, EP, PF, PEI, PI and LCP.

In one specific embodiment, the through channel has a center axis which is located within the longitudinal space.

In one specific embodiment, when the porous tube is assembled in the wafer container, one side surface of the porous tube faces a plurality of wafers in a wafer container, the side surface has a plurality of recesses formed thereon, and a level of each of the recesses is between those of two adjacent wafers in the wafer container.

In one specific embodiment, the porous tube is formed by assembling a top cover, a tower and an open end that are detachable.

It is another object of the present invention to provide a gas diffusion device installed in a wafer container having an accommodating space. The gas diffusion device includes: a buffering gas chamber, configured at a bottom portion of the wafer container, the bottom portion provided with at least one coupling structure defining a through channel having a center axis, the buffering gas chamber having at least one gas intake channel, the gas intake channel, the buffering gas chamber, the through channel and the accommodating space communicating with one another; and at least one porous tube, having a longitudinal space, the porous tube installed to the coupling structure of the wafer container, the longitudinal space of the porous tube communicating with the buffering gas chamber, the buffering gas chamber providing a gas to pass through the porous tube and enter the accommodating space, a gas intake center axis of the gas and a center axis of the coupling structure being coaxial.

In one specific embodiment, the coupling structure is formed as extending from the bottom portion of the wafer container, an open end of the porous tube has a center axis, and the longitudinal space of the porous tube has a center axis. The center axis of the coupling structure, the center axis of the open end of the porous tube and the gas intake center axis are coaxial.

In one specific embodiment, the coupling structure is formed as extending from the bottom portion of the wafer container, an open end of the porous tube has a center axis, and the longitudinal space of the porous tube has a center axis. The center axis of the coupling structure, the center axis of the open end of the porous tube and the gas intake center axis are coaxial. The center axis of the longitudinal space of the porous tube is offset from the center axis of the coupling structure, the center axis of the open end of the porous tube and the gas intake center axis.

In one specific embodiment, the longitudinal space of the porous tube has a closed end and an open end. The open end receives the corresponding coupling structure, so that the gas enters the longitudinal space by passing through the buffering gas chamber and the open end.

In one specific embodiment, the shape of a horizontal cross section of the porous tube is an ellipsoid or an elongated narrow shape having a long axis and a short axis, or a circle having a diameter.

In one specific embodiment, the gas diffusion device further includes: a first collar, arranged in the open end, the first collar located between the open end and the coupling structure.

In one specific embodiment, the gas diffusion device further includes: a second collar, located between the first collar and the coupling structure when the second collar is disposed on the coupling structure so as to reinforce air-tightness.

In one specific embodiment, the material of the first collar is softer than the material of the porous tube to prevent breaking of the open end.

In one specific embodiment, the second collar and the porous tube are sintered or bonded into an integral to prevent breaking of the open end.

In one specific embodiment, the coupling structure, the porous tube, the first collar and/or the collar are/is made of a thermal resistant material which is one or a combination of at least two selected from a group consisting of PEEK, HTPC, FKM, PPS, PPO, chlorinated polyether, POB, TORLON, EP, PF, PEI, PI and LCP.

In one specific embodiment, the gas diffusion device further includes: an airflow guiding member, arranged adjacent to one side of the porous tube, the airflow guiding member configured to adjust an airflow direction of the gas entering the accommodating space.

In one specific embodiment, the gas diffusion device further includes: at least one gas intake module, communicatively coupled to the buffering gas chamber, the gas intake module having the gas intake center axis, supplying the gas in one single gas intake direction to pass through the gas intake channel and enter the buffering gas chamber.

It is another object of the present invention to provide a gas diffusion device installed in a wafer container having an accommodating space. The gas diffusion device includes: a gas cartridge, disposed at a bottom portion of the wafer container so as to define a buffering gas chamber, the bottom portion provided with at least two coupling structures, each of the coupling structures defining a through channel having a center axis, the buffering gas chamber having at least one gas intake channel, the gas intake channel, the buffering gas chamber, the through channel and the accommodating space communicating with one another; and at least two porous tubes, each of the porous tubes having a longitudinal space, the at least two porous tubes respectively installed to corresponding coupling structures of the wafer container, the longitudinal spaces of the two porous tubes communicating with the buffering gas chamber, the buffering gas chamber providing a gas to pass through the at least two porous tubes and enter the accommodating space.

In one specific embodiment, the at least two coupling structures are formed as extending from the bottom portion of the wafer container, an open end of the longitudinal space of each of the porous tubes has a center axis, and the longitudinal space has a center axis. The center axis of each of the through channels, the center axis of the open end of each of the porous tubes, the center axis of the longitudinal space of each of the porous tubes and a gas intake center axis along which the gas passes are coaxial.

In one specific embodiment, the at least two coupling structures are formed as extending from the bottom portion of the wafer container, an open end of each of the porous tubes has a center axis, and the longitudinal space of each of the porous tubes has a center axis. The center axis of each of the through channels, the center axis of the open end of each of the porous tubes and a gas intake center axis along which the gas passes are coaxial. The center axis of the longitudinal space of each of the porous tubes is offset from the center axis of the through channel, the center axis of the open end of the porous tube and the gas intake center axis.

In one specific embodiment, the at least two coupling structures are formed as extending from the bottom portion of the wafer container, an open end of the longitudinal space of each of the porous tubes has a center axis, and the longitudinal space of each of the porous tube has a center axis. The center axis of each of the through channels, the center axis of the open end of each of the porous tubes, and the center axis of the longitudinal space of each of the porous tubes are coaxial. The position of a gas intake center axis along which the gas passes is offset from the center axis of the through channel, the center axis of the open end and the center axis of the longitudinal space that are coaxial.

In one specific embodiment, the at least two coupling structures are formed as extending from the bottom portion of the wafer container, an open end of each of the porous tubes has a center axis, and the longitudinal space of each of the porous tubes has a center axis. The center axis of each of the through channels and the center axis of the open end of each of the porous tubes are coaxial. A gas intake center axis along which the gas passes and the center axis of the longitudinal space are both offset from the center axis of the through channel and the center axis of the open end that are coaxial.

In one specific embodiment, the gas cartridge has a bottom portion and a sidewall extending from the bottom portion, and the gas intake channel is formed at the bottom portion of the gas cartridge.

In one specific embodiment, the gas cartridge is installed at the bottom portion of the wafer container, such that the bottom portion and the sidewall of the gas cartridge and the bottom portion of the wafer container define the buffering gas chamber.

In one specific embodiment, a plurality of annular sidewalls further extend from a lower surface of the bottom portion of the gas cartridge. Each of the annular sidewalls defines an installation space for filling with a gas intake module. The gas intake module has the gas intake center axis. The installation space, the gas intake channel at the bottom portion of the gas cartridge and the buffering gas chamber communicate with one another, such that the gas in one single air intake direction supplied by the gas intake module passes through the gas intake channel and enters the buffering gas chamber.

In one specific embodiment, the wafer container includes a base plate installed at the bottom portion of the wafer container, and the buffer gas chamber is between the bottom portion and the base plate of the wafer container.

In one specific embodiment, the base plate is made of a material including a self-lubricating material.

It is yet another object of the present invention to provide a wafer container including: a shell, including a bottom portion, the bottom portion configured with a plurality of coupling structures, the coupling structures defining a plurality of through channels; a buffering gas chamber, formed below the bottom portion, the buffering gas chamber having a plurality of gas intake channels, the gas intake channels fluid communicating with the corresponding through channels; and a plurality of porous tubes, each of the porous tubes having an open end, the open end correspondingly connecting with the coupling structure at the bottom portion and communicating with the buffering gas chamber via the corresponding through channel, allowing a gas to pass through the porous tubes and enter an accommodating space of the shell.

In one specific embodiment, the wafer container further includes a door detachably combined with the shell, and a pair of support portions configured on an inner side of the shell. The wafer container is made of a thermal resistance material which is one or a combination of at least two selected from a group consisting of PEEK, HTPC, FKM, PPS, PPO, chlorinated polyether, POB, TORLON, EP, PF, PEI, PI and LCP.

In one specific embodiment, the wafer container includes a base plate connected below the shell to support the shell, and the buffering gas chamber is between the bottom portion and the base plate of the shell.

BRIEF DESCRIPTION OF THE DRAWINGS

Reference can be made to the drawings and description below to better understand the present invention. Non-limiting and non-exhaustive embodiments are described with reference to the drawings below. It is to be noted that the components in the drawings are not necessarily drawn to their actual sizes, and are depicted to focus on the description on structures and principles.

DETAILED DESCRIPTION OF THE EMBODIMENTS

To better describe the present invention, specific examples and specific embodiments are given with the accompanying drawings below. However, the subject matter of the application may be specifically implemented in various different forms, and the construction covered or asserted by the subject matter of the application is not limited to any exemplary specific embodiments disclosed in the detailed description of the application; it should be understood that the specific embodiments are non-limiting and are not to be construed as restrictive. Similarly, the present invention is to provide a reasonably broad scope for the subject matter applied or covered by the subject matter. In addition, the asserted subject matter may be implemented in form of a method, device or system.

The expression "one embodiment" used in the literature of the application does not necessarily refer to the same specific embodiment, and the expression "other/another (some/certain) embodiments" used in the literature of the application does not necessarily refer to different specific embodiments. The object of the above is, for example, to include combination of all or part of the exemplary specific embodiments by the subject matter set forth.

Figure 2:
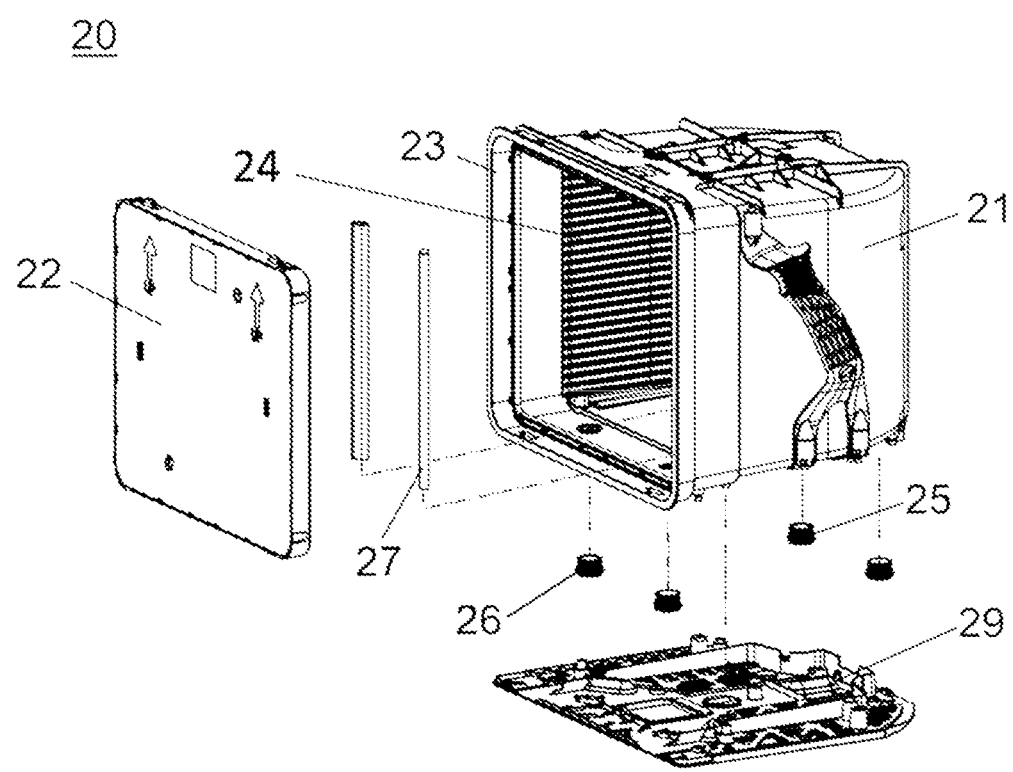
FIG. 2 is an exploded diagram of a wafer container according to a first embodiment of the present invention.
Figure 3:
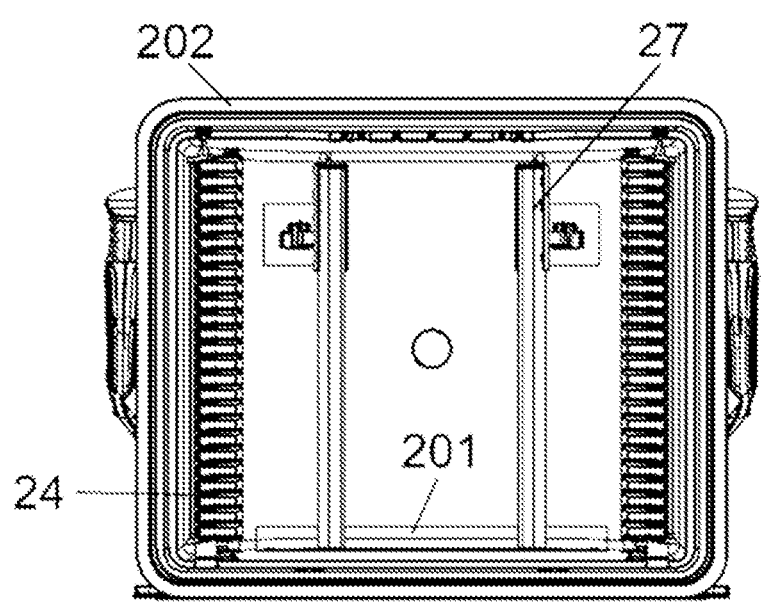
FIG. 3 is a front view of a wafer container according to the first embodiment of the present invention.
Figure 4:
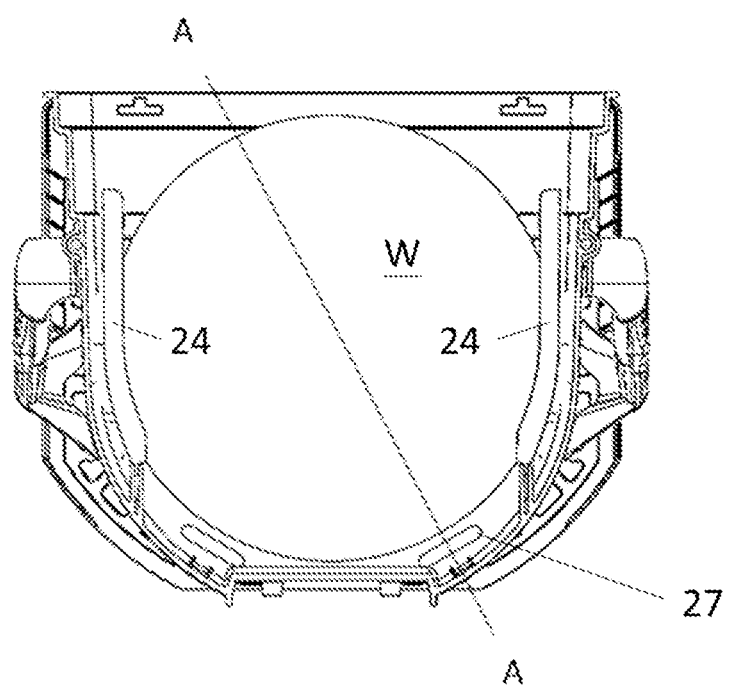
FIG. 4 is an internal top view of a wafer container according to the first embodiment of the present invention.
Figure 5:
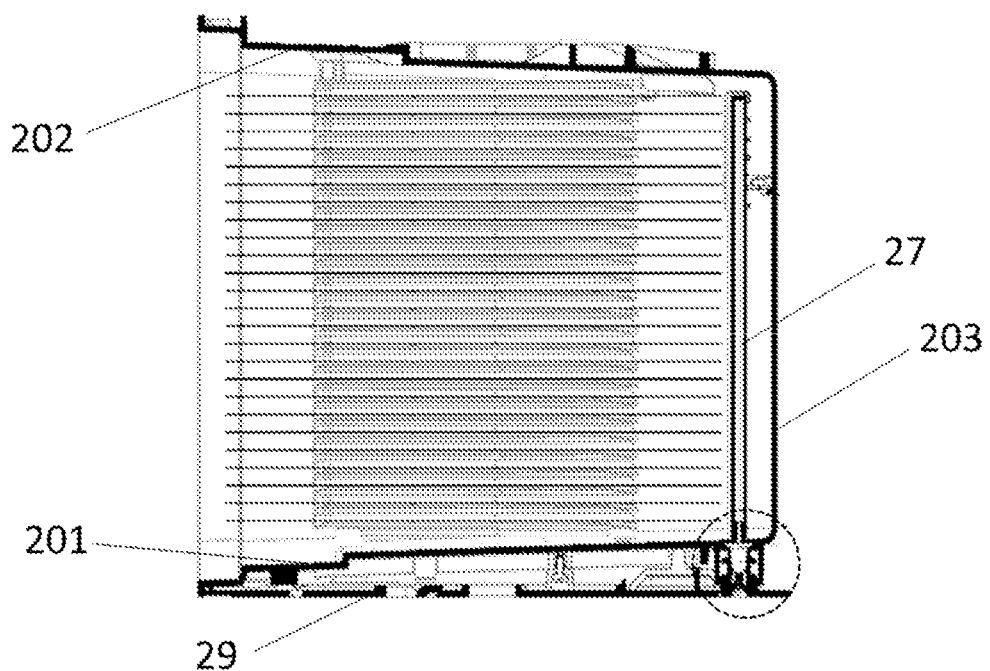
FIG. 5 is a section diagram of FIG. 4 along the line A-A.
Figure 12A:
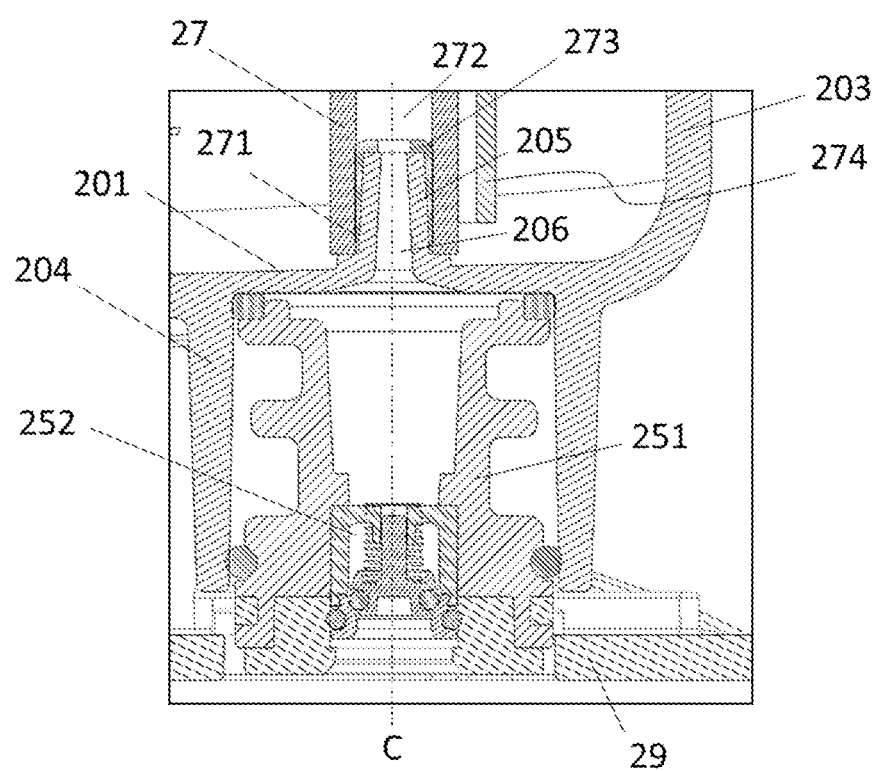
FIG. 12A and FIG. 12B show a gas diffusion device according to a third embodiment of the present invention.
Figure 12B:
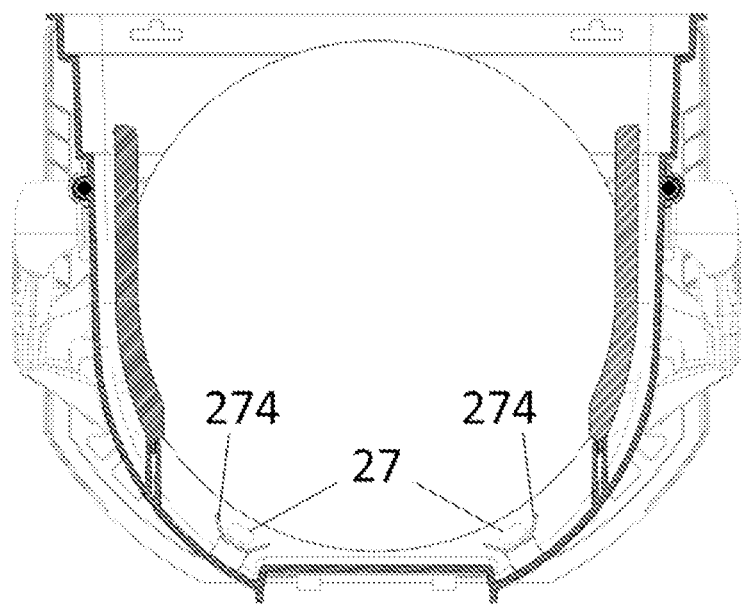

Refer to FIG. 2 to FIG. 5. FIG. 2 shows an exploded diagram of a wafer container (20) according to a first embodiment of the present invention. FIG. 3 shows a front view (excluding a door) of the wafer container (20) according to the first embodiment of the present invention. FIG. 4 shows an internal top view (including wafers W) of the wafer container (20) according to the first embodiment of the present invention. FIG. 5 shows a section diagram of FIG. 4 according to the line A-A. The wafer (20) includes a shell (21) and a door (22). The shell (21) has an accommodating space for accommodating wafers. The door (22) is detachably connected to an opening (23) on a front end of the shell (21), so as to open and close the accommodating space. A pair of support portions (24) are individually configured in the accommodating space of the shell (21), and are respectively located on opposite inner sidewalls of the shell (21). Moreover, the sizes and areas of the support portions (24) are sufficient for supporting and stacking multiple wafers. A gas intake module (25) is detachably assembled at a bottom portion of the wafer container (20), and is close to a rear end of the water container (20). A gas discharge module (26) is detachably assembled at the bottom portion of the wafer container (20), and is close to a front end of the water container (20). In this embodiment, the numbers of the gas intake module (25) and the gas discharge module (26) are two for example, and the numbers used can be adjusted in response to actual operations. A bottom end of a porous tube (27) (or a gas tower) is detachably assembled on the rear end of the wafer container (20) and fluid communicates with the gas intake module (25). A top end of the porous tube (27) may be positioned an on inner side of the shell (21) by a positioning component (not shown). Although not shown in FIG. 2, an airflow guiding member or a baffle plate may be provided between the porous tube (27) and the rear end of the shell (21), as shown in FIG. 12A and FIG. 12B. The bottom portion of the shell (21) is detachably connected to a base plate (29).

As shown in FIG. 3 to FIG. 5, the porous tube (27) is located in the rear end of the wafer container (20), and extends vertically from a bottom portion (201) toward a top portion (202) of the wafer container (20). The height extending by the porous tube (27) covers as much as possible a stacking height of a maximum number of wafers (W) that can be accommodated in the accommodating space, or is at least greater than that of an upper surface of the wafer (W) located at an uppermost position. Gas discharge holes of the porous tube (27) are fundamentally configured at levels between wafers and blow in a direction toward the opening (23). The present invention adopts a straight-through configuration, and so a space is preserved between inner walls (203) of the wafer container (20). This space is sufficient for accommodating the porous tubes (27), and the structural design of the porous tubes (27) can be adjusted in response to actual requirements, hence providing applications of numerous different variations examples, with associated details to be described shortly.

Figure 6:
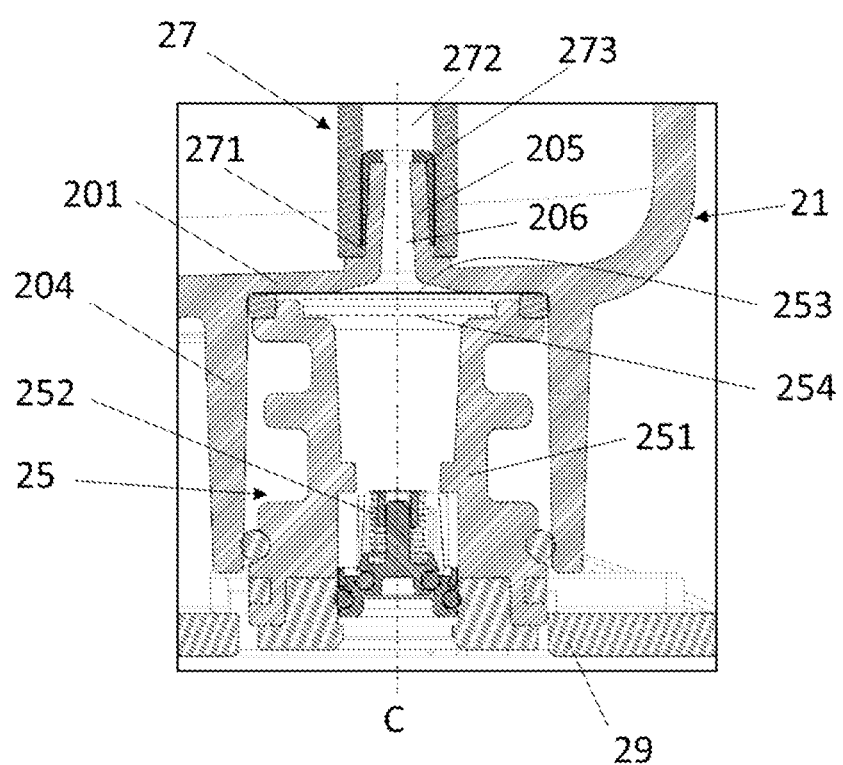
FIG. 6 is an enlarged partial diagram of FIG. 5, showing a gas diffusion device according to the first embodiment of the present invention.

FIG. 6 shows an enlarged partial diagram of FIG. 5 (as indicated by dotted lines), showing a gas diffusion device according to the first embodiment of the present invention. The gas intake module (25) and the porous tube (27) are installed on the shell (21) of the wafer container (20). The gas intake module (25) includes an elastic sleeve (251) and a check valve (252). The elastic sleeve (251) has a gas intake channel passing through two ends thereof, and the check valve (252) is securely accommodated in the gas intake channel. A filter membrane (253) is configured between the elastic sleeve (251) and the bottom portion (201) of the shell (21) to filter an incoming gas. To prevent an overly large pressure of the incoming gas from causing a deforming or a breaking of the filter membrane (253), the elastic sleeve (251) has a larger diameter at the inner wall close to the bottom portion (201), and so a buffering gas chamber (254) is formed between the gas intake channel and the filter membrane (253). Before passing through the filter membrane (253), the gas is dispersed laterally in the buffering gas chamber (254), so as to reduce the pressure applied on the filter membrane (253). At least one annular sidewall (204) extending downward is formed at the bottom portion (201) of the shell (21), and defines an installation space for accommodating the gas intake module (25). The outer diameter of the elastic sleeve (251) may be slightly larger than the inner diameter of the annular sidewall (204), and a sealing ring may be provided between the elastic sleeve (251) and the annular sidewall (204), thereby securely accommodating the elastic sleeve (251) in the installation space of the annular sidewall (204). A plurality of flanges are formed on an outer side of the elastic sleeve (251); however, in other embodiments, an outer side surface of the elastic sleeve (251) may also be a flat surface.

Figure 1:
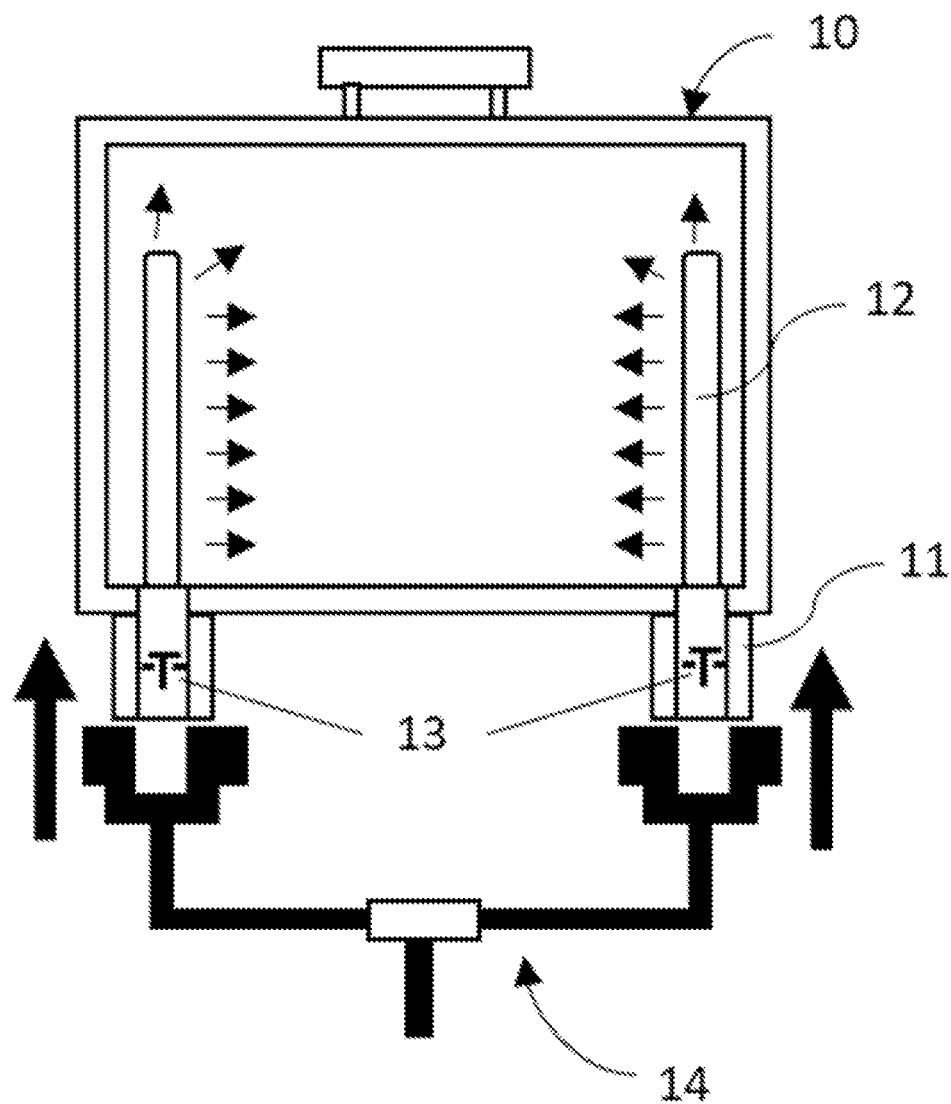
FIG. 1 is a schematic diagram of a conventional wafer container filled with a gas by a pair of diffusion assemblies.

The base plate (29) is capable of retaining the gas intake module (25) in the installation space of the annular sidewall (204). When the base plate (29) is assembled to the bottom portion (201) of the shell (21), a part of the base plate (29) is held at the bottom end of the elastic sleeve (251), such that the elastic sleeve (251) is clamped between the bottom portion (201) and the base plate (29). As shown in FIG. 1, a gas filling disk surface (14) can be held below the base plate (29) and apply a fluid (for example, a gas) pressure on the check valve (252) in the elastic sleeve (251) to open the check valve (252), so as to allow the gas to pass through the check valve (252) and enter the gas intake channel of the elastic sleeve (251). In this embodiment, the base plate (29) includes an operable locking component for locking or releasing the elastic sleeve (251). The filter membrane (253) may be configured in the gas intake channel of the elastic sleeve (251) to filter out particles, thus effectively preventing particles from entering the accommodating space of the wafer container (20). The base plate (29) is usually placed on a load port of an apparatus, and may be selectively made of a self-lubricating material, which is fundamentally a composite material including at least two materials. Thus, the coefficient of friction of part or all of the base plate (29) is lower than the coefficient of friction of a contact interface of the load port, so as to more readily move the base plate (29) on the interface of the load port.

At least one coupling structure (205) is provided at the bottom portion (201) of the wafer container (20). For example, the coupling structure (205) is formed as extending upward from an inner side surface of the bottom portion (201) of the shell (21), and the structure of the coupling structure (205) may be designed as a tower-like nozzle and has a through channel (206) passing through the bottom portion (201) and the accommodating space. The coupling structure (205) is configured to connect the porous tube (27). The porous tube (27) has a longitudinal space (272), which has a closed end and an open end (271). The outer diameter of the coupling structure (205) is slightly smaller than the inner diameter of the porous tube (27), such that the open end (271) of the porous tube (27) can sleeve the coupling structure (205) and the gas can pass through the through channel (206) and enter the longitudinal space (272) of the porous tube (27).

Gas filling by applying a straight-through manner of the present invention is described below. The coupling structure (205) defines the through channel (206) having a center axis (C). It should be noted that, a gas intake center axis of the gas and the center axis (C) of the coupling structure (205) are coaxial, and a center axis of the gas intake module (25) and the gas intake center axis are also coaxial, wherein the gas intake module (25) supplies the gas in one single gas intake direction that passes through the gas intake channel and enters the buffering gas chamber (254). As shown in FIG. 6, in the gas diffusion device according to the first embodiment, the gas intake channel, the buffering gas chamber (254), the through channel (206) and the accommodating space communicate with one another. Since the porous tube (27) is installed to the coupling structure (205) of the wafer container (20), the longitudinal space (272) of the porous tube (27) communicates with the buffering gas chamber (254). Moreover, the open end (271) of the porous tube (27) has a center axis, and the longitudinal space (272) of the porous tube (27) has a center axis. When the center axis (C) of the coupling structure (205), the center axis of the open end (271) of the porous tube (27) and the gas intake center axis are coaxial, the gas in one single gas intake direction supplied by the gas intake module (25) passes through the gas intake channel and enters the buffering gas chamber (254), and the buffering gas chamber (254) then allows the gas to sequentially pass through the open end (271) and the longitudinal space (272) of the porous tube (27) to enter the accommodating space. Such straight-through configuration ensures that the airflow follows a straight path to enter the porous tube (27) from the gas intake module (25), and provides a shortest path for the gas to directly purge the wafers in the accommodating space, hence enhancing purging efficiency as well as effectively mitigating the problem of increased humidity when the door (22) opens from the shell (21). In other words, the present invention is capable of solving various drawing including degraded purging efficiency and increased humidity of the gas in the accommodating space caused by an increased airflow path of the conventional winding structural design.

Further, the present invention further includes at least one collar (273), which is configured to be connected in the open end (271) of the porous tube (27). The collar (273) has a buffering and protection effect, and is made of material that is softer than the material of the porous tube (27). When the open end (271) of the porous tube (27) is assembled to the corresponding coupling structure (205) on the bottom portion (201) of the wafer container (20), the collar (273) can prevent stress engagement between the open end (271) and the couplings structure (205) and hence from the problem of breaking of the open end (271) or the entire porous tube (27). The collar (273) of the present invention may be an independent component, or the collar (273) and the porous tube (27) may be sintered or bonded into an integral. The porous tube (27) and the collar (273) are made of a thermal resistant material, which is one or a combination of at least two selected from a group consisting of PEEK, HTPC, FKM, PPS, PPO, chlorinated polyether, POB, TORLON, EP, PF, PEI, PI and LCP.

Figure 7:
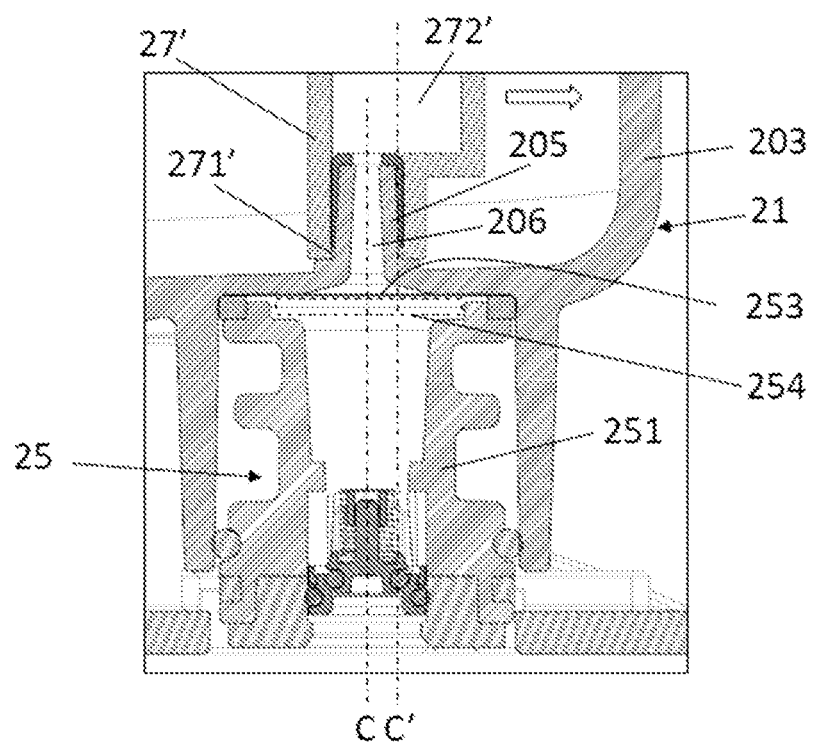
FIG. 7 shows a gas diffusion device according to a second embodiment of the present invention.

FIG. 7 shows a gas diffusion device according to a second embodiment of the present invention. One primary difference from the gas diffusion of the first embodiment is that, along with an increasing demand of the amount of diffusion airflow, without changing the area of the accommodating space of the existing wafer container, the present invention designs a porous tube (27') structure capable of increasing the amount of airflow by providing a maximum space utilization rate for the space between the wafers and the inner walls (203) of the wafer container (20). The size of the porous tube (27') is increased, and the increased part extends toward the inner walls (203) of the shell (21). Without changing the structural design where the gas intake center axis of the gas and the center axis (C) of the coupling structure (205) are coaxial, the center axis of the open end (271) of the porous tube (27') and a center axis (C') of a longitudinal space (272') are non-coaxial, because the size of the porous tube (27') is increased toward the inner walls (203) of the shell (21). That is to say, the center axis (C') of the longitudinal space (272') of the porous tube (27') is offset from the center axis (C) of the coupling structure (205), the center axis of the open end (271) of the porous tube (27') and the gas intake center axis.

It should be understood that, although the center axis (C) of the coupling structure (205) and the center axis (C') of the longitudinal space (272') of the porous tube (27') are non-coaxial, but the center axis (C) of the coupling structure (205), the center axis of the open end (271') of the porous tube (27') and the gas intake center axis are still coaxial. Thus, the gas in one single gas intake direction supplied by the gas intake module (25) passes through the gas intake channel and enters the buffering gas chamber (254), and the buffering gas chamber (254) then allows the gas to sequentially pass through the open end (271') and the longitudinal space (272') of the porous tube (27') and enter the accommodating space. That is, the airflow fundamentally still follows a shortest path (straight-through manner) for the gas to directly purge the wafers in the accommodating space. Moreover, with the increased size of the porous tube (27') and the increased amount of airflow, purging efficiency is enhanced at the same time.

Figure 8A:
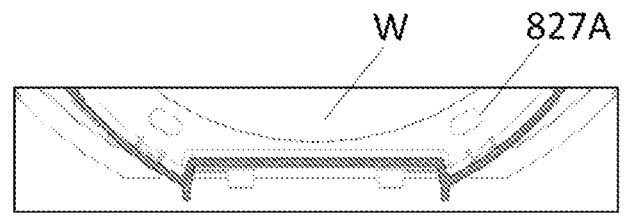
FIG. 8A and FIG. 8B show different variation examples of shapes of a porous tube.
Figure 8B:
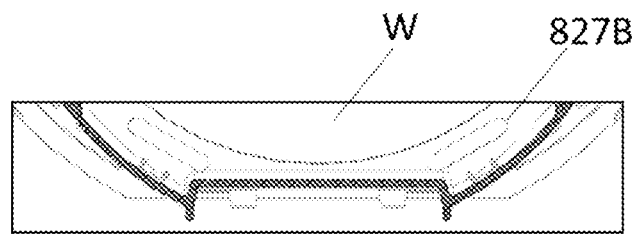

FIG. 8A and FIG. 8B are partial top views of an interior of a wafer container, showing different variation examples of shapes of the porous tubes (827A, 827B). To prevent an interference on edges of the wafers (W), the shape of the porous tubes (827A, 827B) is an elongated narrow shape having a long axis and a short axis, wherein the short axis is usually a primary direction of gas diffusion and may be directed toward the centers of the wafers. The porous tube (827B) in FIG. 8B extends longer in the long axis direction, so that the porous can provide a broader coverage range for gas diffusion.

Figure 9A:
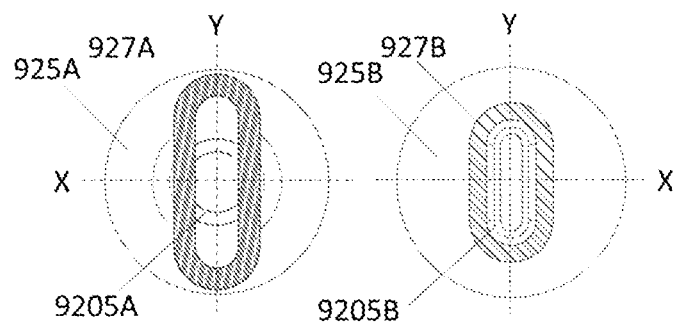
FIG. 9A and FIG. 9B show relations between different shapes of a porous tube and a gas intake module.
Figure 9B:
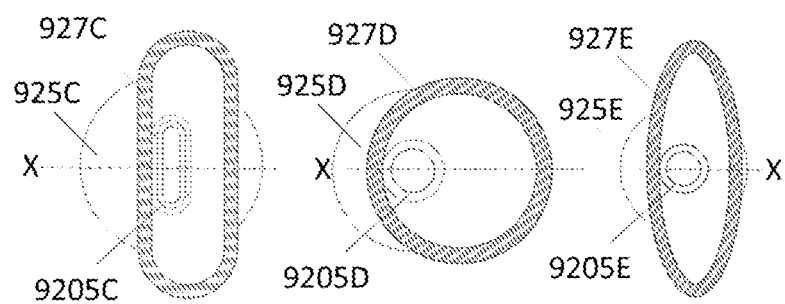

FIG. 9A and FIG. 9B show perspectives of top views to present relations between different shapes of a porous tube, a coupling structure and a gas intake module.

In FIG. 9A, a porous tube (927A, 927B), a coupling structure (9205A, 9205B) and a gas intake module (925A, 925B) are coaxial. The shape of a horizontal cross section of a longitudinal space of the porous tubes (927A, 927B) is an elongated narrow shape having a short axis (X) and a long axis (Y), and a horizontal cross section of a through channel of the coupling structure (9205A, 9205B) is a circle. And both of the shapes of a horizontal cross section of a longitudinal space of the porous tubes (927A, 927B) and a horizontal cross section of a through channel of the coupling structure (9205A, 9205B) are an elongated narrow shape. In this embodiment, the porous tube is not limited to being an elongated narrow shape, and the shape of the structure may be adjusted in response to actual requirements, so as to change the flow direction of the gas and increase the area for purging the wafers in the accommodating space; for example, the cross section area along the long axis (Y) of the porous tube (927A) is greater than that along the long axis (Y) of the porous tube (927B), and thus the gas discharge area is also larger.

Also referring to FIG. 7, the center axis of the open end of a porous tube (927C, 927D, 927E) is offset from a coupling structure (9205C, 9205D, 9205E) and a gas intake module (925C, 925D, 925E). The shape of the horizontal cross section of the longitudinal space of the porous tube (927C, 927D, 927E) may be the elongated narrow shape, a circle having a diameter and an ellipsoid having a diameter, respectively, and the shape of the cross section of the through channel of the coupling structure (9205C, 9205D, 9205E) may be an elongated narrow and circles, respectively. The center axes of the coupling structures (9205C, 9205D, 9205E) are all located in the longitudinal spaces of the porous tubes (927C, 927D, 927E). In this embodiment, to increase the area for purging the wafers in the accommodating space, the cross section areas along the short axes (X) of the porous tubes (927C, 927D, 927E) are increased, and so the gas discharge areas are correspondingly increased. To prevent the increased cross section areas from interfering the wafers, the cross section areas along the short axes (X) of the porous tubes (927C, 927D, 927E) extend toward the inner walls (203) of the shell (21).

Figure 10A:
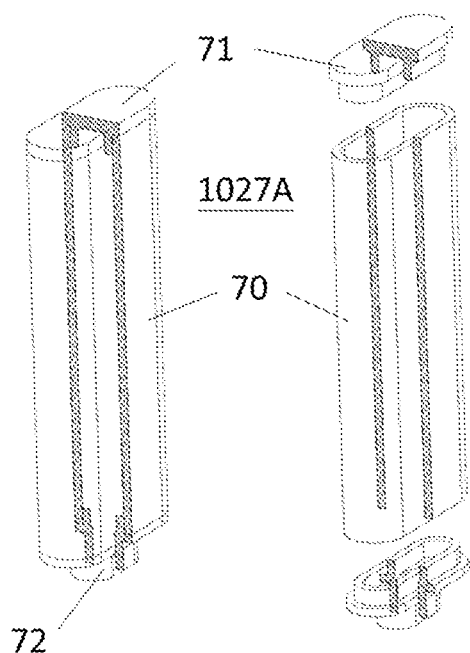
FIG. 10A and FIG. 10B show (coaxial) porous tubes according to different embodiments.
Figure 10B:
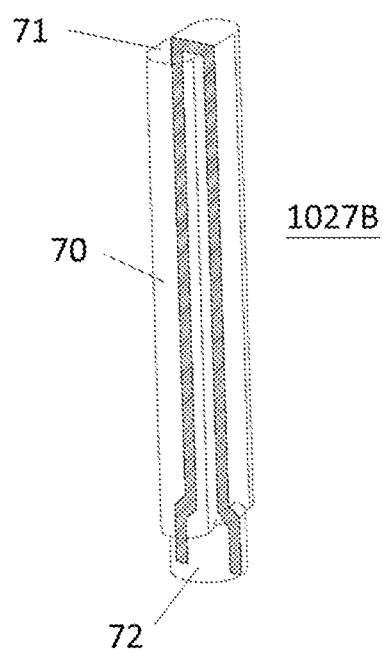

Considering certain restrictions of injection molding, FIG. 10A and FIG. 10B show (coaxial) porous tubes according to different embodiments. FIG. 10A shows an assembly and exploded diagram of a porous tube (1027A), which has a tower (70) extending longitudinally, a top cover (71) and an open end (72). The top cover (71) serves as a closed end, and the top cover (71) and the open end (72) are respectively detachably connected to a top end and a bottom end of the tower (70) so as to define a longitudinal space. The area of the longitudinal space shown in FIG. 10A is greater than the area of an opening space of the open end (72). The tower (70), the top cover (71) and the open end (72) of the porous tube (1027B) in FIG. 10B are a formed integral, and so the area of the longitudinal space is greater than the area of the opening space of the open end (72). These two types of porous tubes (1027A, 1027B) may provide different gas diffusion performance, and both have a characteristic that the center axis of the longitudinal space and the center axis of the open end (72) are coaxial.

Figure 11A:
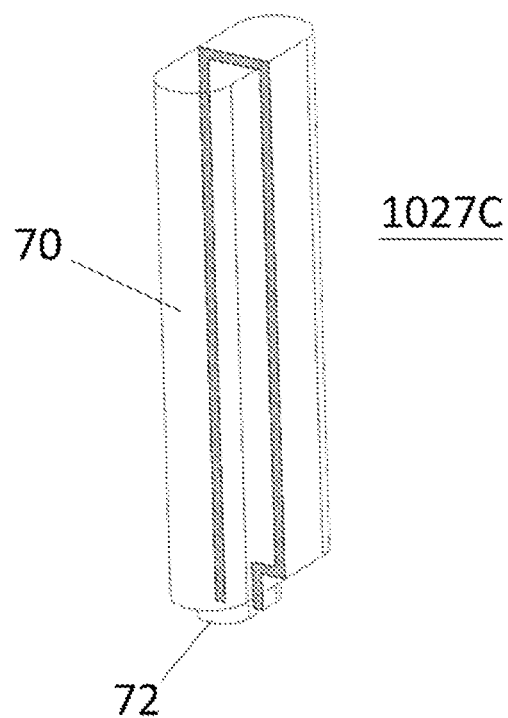
FIG. 11A and FIG. 11B show (non-coaxial) porous tubes according to different embodiments.
Figure 11B:
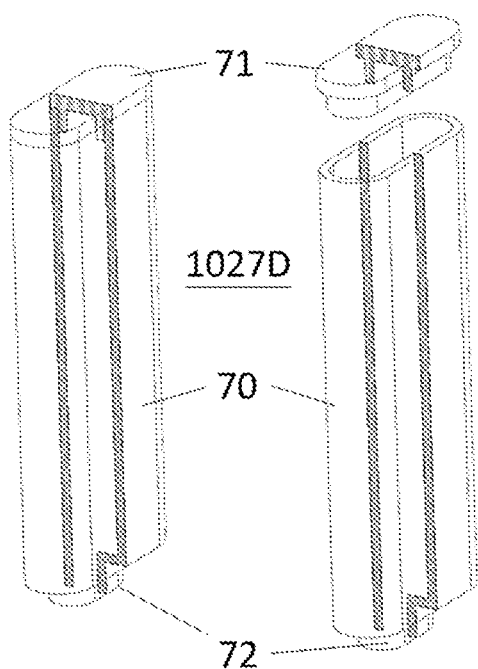

FIG. 11A and FIG. 11B shows (non-coaxial) porous tubes according to different embodiments. A porous tube (1027C, 1027D) has a characteristic that the longitudinal space is offset from the center axis of the open end (72). As shown in FIG. 11A, the porous tube (1027C) may be an integral component, and the area of the longitudinal space of the tower (70) of the porous tube (1027C) is greater than the opening space of the open end (72). Again referring to FIG. 11B, the tower (70) and the top cover (71) of the porous tube (1027D) are detachable, the tower (70) and the open end (72) are an integral component, and the area of the longitudinal space of the tower (70) is larger than the area of the opening space of the open end (72).

FIG. 12A and FIG. 12B show a gas diffusion device according to a third embodiment of the present invention. The cross section side view of FIG. 12A shows that an airflow guiding member, that is, a baffle plate (274), is further provided between the porous tube (27) and the inner walls (203). The baffle plate (274) extends longitudinally along the porous tube (27) and has a same or slightly higher extension height. As shown in FIG. 12B, the shape of a horizontal cross section of the baffle plate (274) is defined by at least one arc so as to shield a partial periphery of the porous tube (27). In an example where the porous tube (27) is configured to perform radial diffusion, the baffle plate (274) guides the gas and returns the gas back to a region of the wafers, so as to prevent excessive gas from flowing meaninglessly on the inner side of the shell. The structure and pattern of the baffle plate (274) are not limited in the present invention, and the structural angle and shape of the baffle plate (274) may be adjusted in response to actual requirements, so as to achieve the requirement and object of controlling the direction of airflow.

Figure 13A:
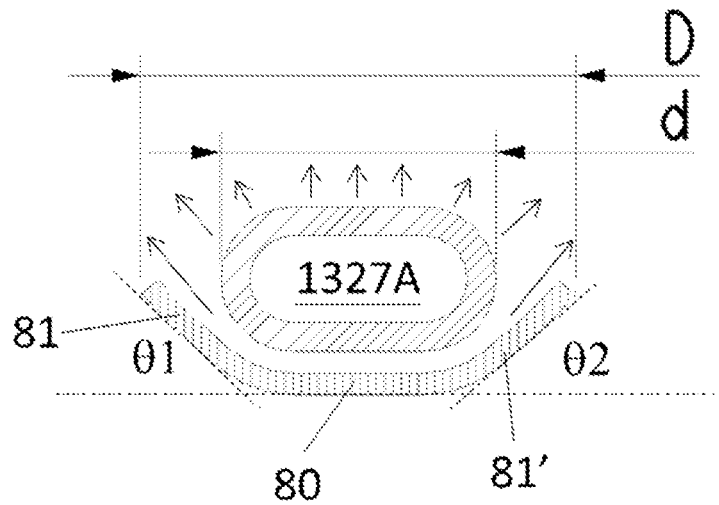
FIG. 13A and FIG. 13B are schematic diagrams of variations examples of a porous tube and a baffle plate.
Figure 13B:
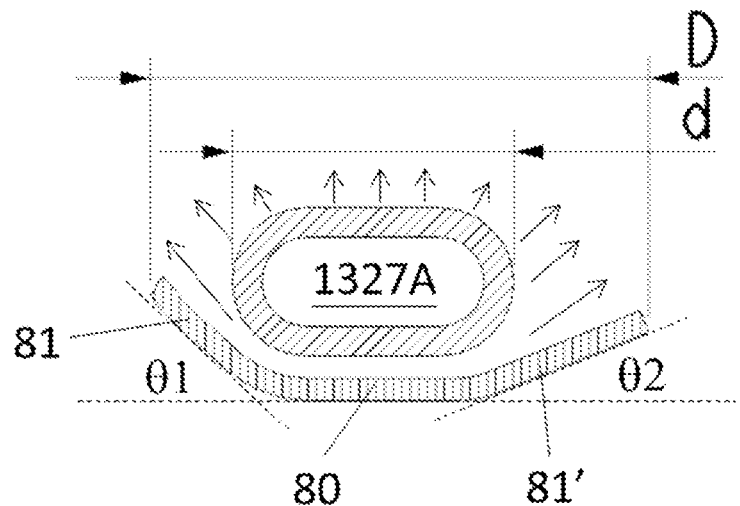

FIG. 13A and FIG. 13B shows schematic diagrams of variations examples of a porous tube and a baffle plate. Taking a porous tube (1327A) being an elongated narrow shape for example, the baffle plate is formed by a backplate (80) and two flanks (81, 81'). A horizontal length (d) of the porous tube (1327A) is smaller than a horizontal length (D) of the baffle plate. An included angle between the flank (81) and the backplate (80) is $\theta 1$, and an included angle between the flank (81') and the backplate (80) is $\theta 2$. FIG. 13A shows that the included angles $\theta 1$ and $\theta 2$ and shapes of the two flanks (81, 81') are the same, and so the controlled directions of airflow are controlled to be the same. FIG. 13B shows that the shapes of the two flanks (81, 81') are the same, but the included angles $\theta 1$ and $\theta 2$ are different, and so the controlled directions of airflow are different, with the diffusion direction of airflow with respect to the included angle $\theta 2$ being greater than that with respect to the included angle $\theta 1$. It should be understood that, the included angle and shape of the flank can determine the performance of gas diffusion.

Figure 14A:
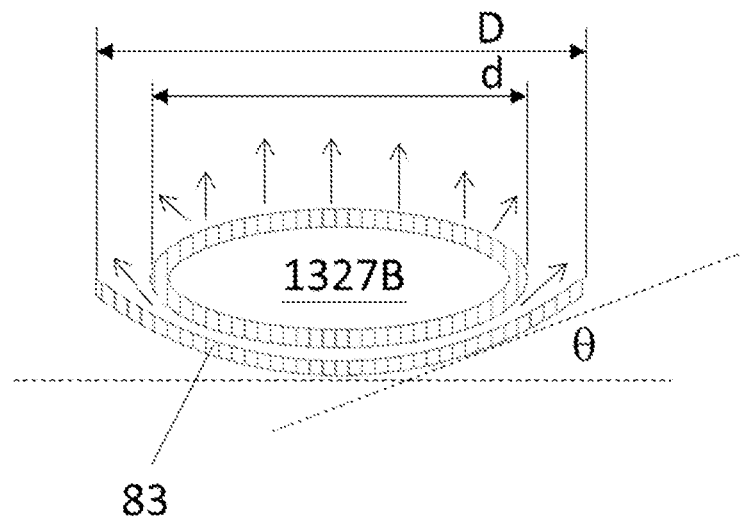
FIG. 14A and FIG. 14B are schematic diagrams of other variation examples of a porous tube and a baffle plate.
Figure 14B:
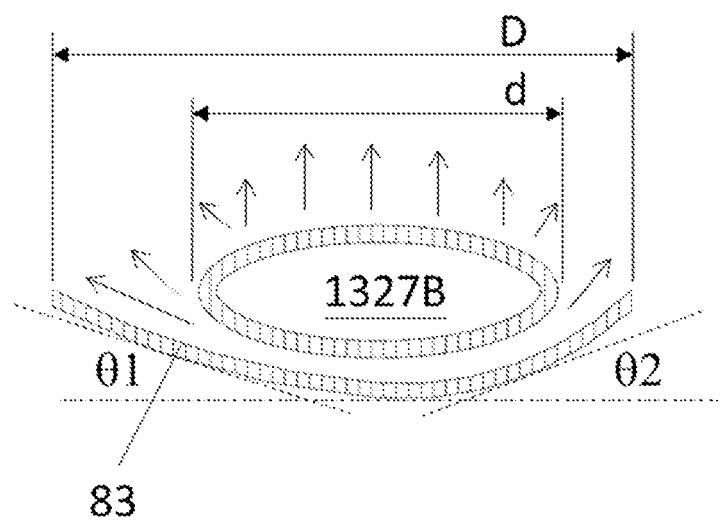

FIG. 14A and FIG. 14B shows schematic diagrams of other variation examples of a porous tube and a baffle plate. Taking a porous tube (1327B) being an ellipsoid for example, the baffle plate is an arc backplate (83). A horizontal length (d) of the porous tube (1327B) is smaller than a horizontal length (D) of the baffle plate. Two side ends to a vertex of the arc backplate (83) may define an included angle $\theta$. When the extension length (D) of the included angle $\theta$ with respect to the two side ends are different, the controlled directions of airflow are also different. FIG. 14A shows that the included angles $\theta$ and arcs on the two sides of the arc backplate (83) are the same, that is, the controlled directions of airflow are the same. FIG. 14B shows that the extension length (D) and the included angles $\theta 1$ and $\theta 2$ on the two sides are different, and so the controlled directions of airflow are also different, wherein the diffusion angle of airflow with respect to the included angle $\theta 1$ is greater than that with respect to the included angle $\theta 2$.

Figure 15A:
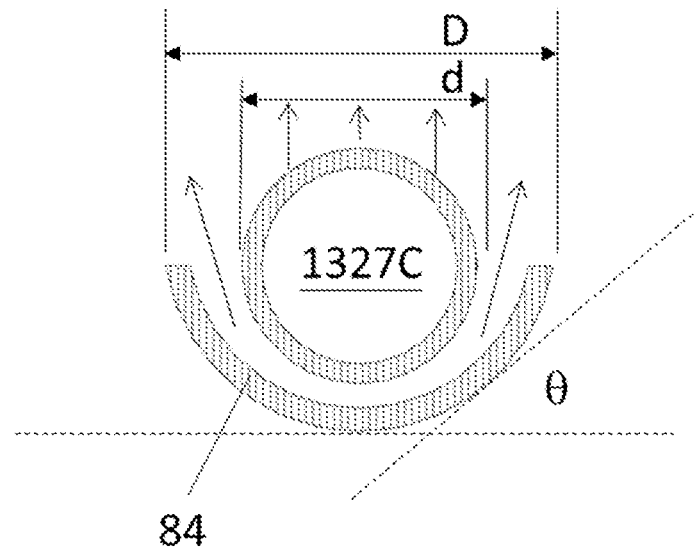
FIG. 15A and FIG. 15B are schematic diagrams of yet other variations examples of a porous tube and a baffle plate.
Figure 15B:
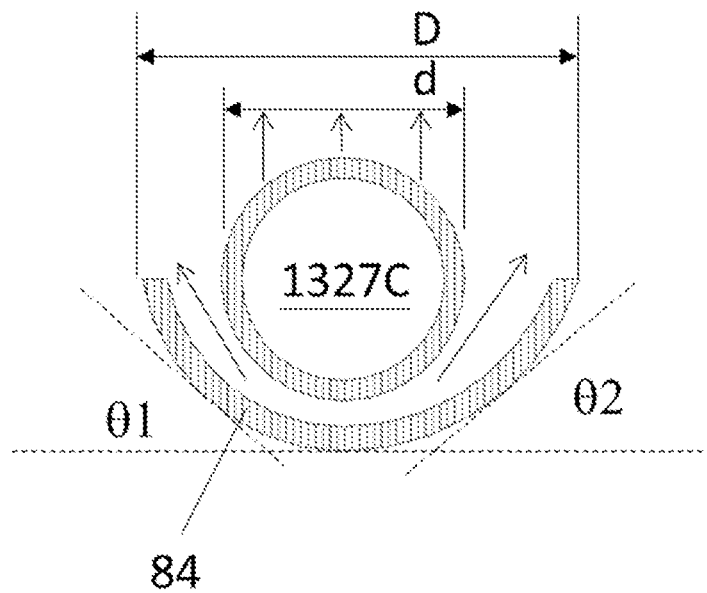

FIG. 15A and FIG. 15B show schematic diagrams of yet other variations examples of a porous tube and a baffle plate. Taking a porous tube (1327C) being a circle for example, the baffle plate is an arc backplate (84). A horizontal length (d) of the porous tube (1327C) is smaller than a horizontal length (D) of the baffle plate. Two side ends to a vertex of the arc backplate (84) may define an included angle $\theta$. FIG. 15A shows that the included angles $\theta$ and arcs on the two sides of the arc backplate (84) are the same, which means the controlled directions of airflow are the same. FIG. 15B shows that the extension length (D) and the included angles $\theta 1$ and $\theta 2$ on the two sides are different, and so the controlled directions of airflow are also different, wherein the diffusion angle of airflow with respect to the included angle $\theta 2$ is greater than that with respect to the included angle $\theta 1$.

It is known from the variation examples above that, the baffle plate may be a symmetrical or asymmetrical configuration with respect to the porous tube. In an asymmetrical configuration, the degree of asymmetry may be determined by the included angle $\theta$, or may be achieved by the baffle plate and by means of being staggered from the porous tube. The included angle θ may be between 0 degree and 90 degrees; however the present invention is not limited to the examples above. By applying the baffle plate in conjunction with the porous tube, in addition to achieving the object of controlling the direction of airflow, the issue of turbulence generated in the interior space of the wafer container (20) due to gas discharge in a 360-degree manner of a conventional circular tube structure is also resolved.

Figure 16:
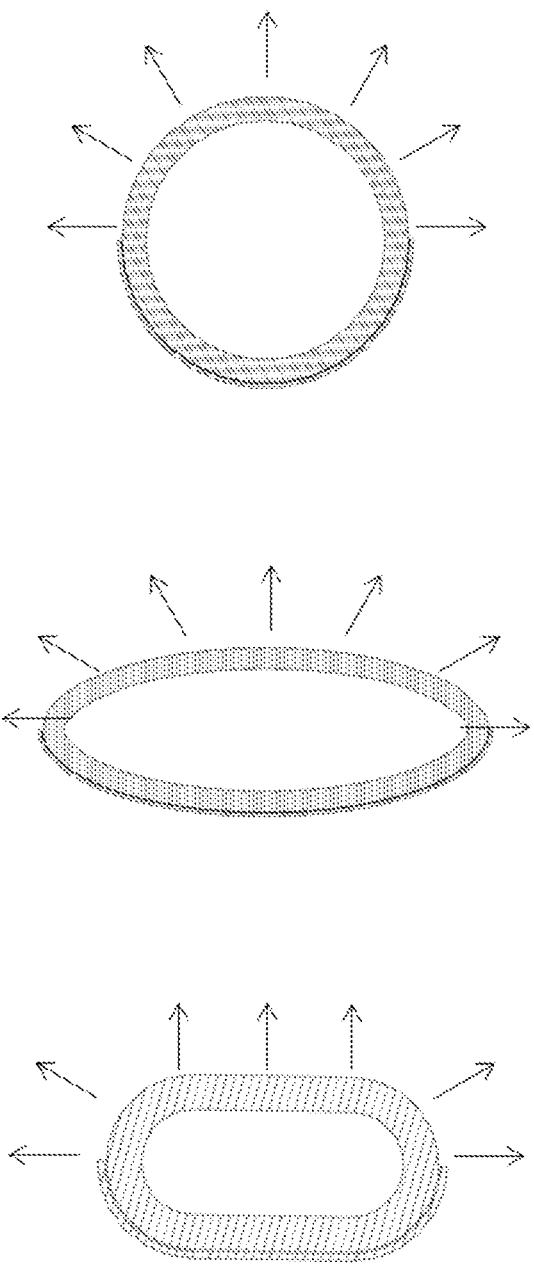
FIG. 16 is a variation example of a combination of a porous tube and a baffle plate.

FIG. 16 shows schematic diagrams of variation examples of combinations of a circular porous tube, an ellipsoidal porous tube and an elongated narrow porous tube. These baffle plates may be formed to match outer surfaces of these porous tubes; that is, the baffle plates may be adhered to the outer surfaces of these porous tubes to form seamless combinations. In the case where the porous tube is in a radiation diffusion form, part of the diffusion holes may be shielded by the baffle plate such that the gas is forced to be diffused through the unshielded part, hence increasing the amount of flow in all directions. In other embodiments, the porous tube may also has part of the diffusion holes formed thereon to achieve the same object.

Figure 17:
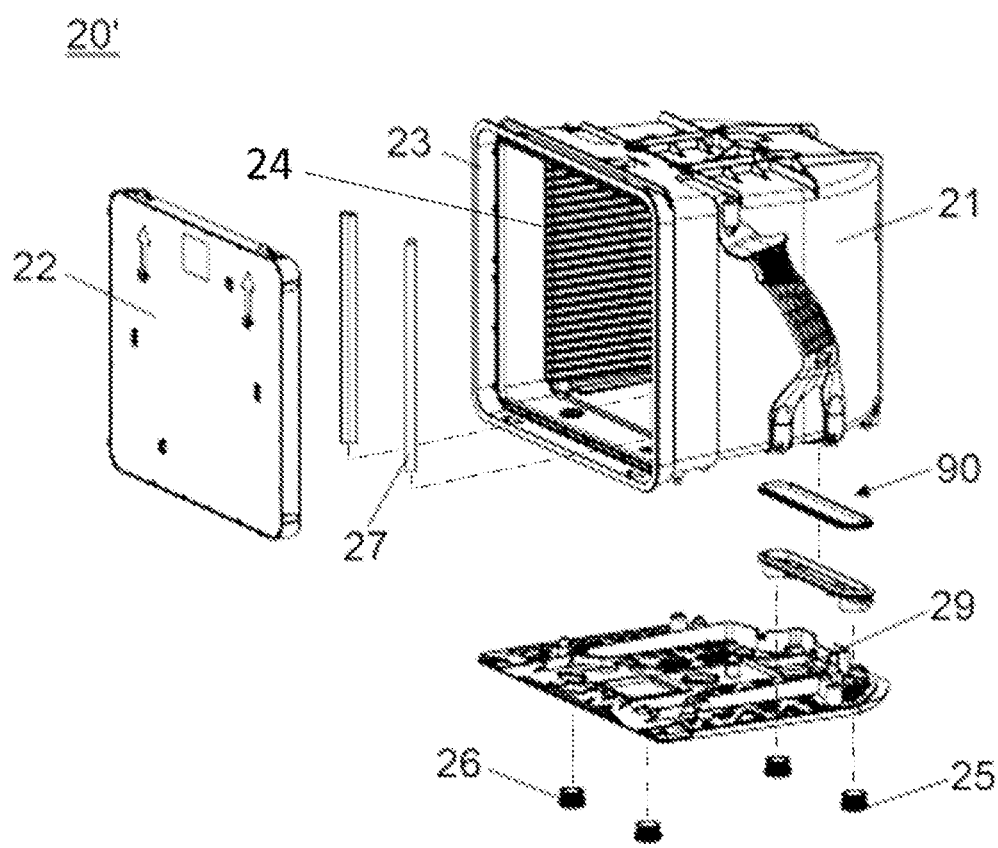
FIG. 17 shows a wafer container according to a second embodiment of the present invention.

FIG. 17 shows a wafer container (20') according to a second embodiment of the present invention. The same element numerals and symbols and the same associated details of the wafer container (20') as those of the wafer container (20) of the first embodiment are omitted herein for brevity, and only the differences are described. The wafer container (20') of the second embodiment includes a gas cartridge (90), which is detachably connected to the bottom portion of the shell (21). The gas cartridge (90) can provide effects of a buffering tolerance and a communicating space for the gas before the gas enters an interior space of the wafer container (20'), with associated details given below. When the base plate (29) is assembled to the bottom portion of the shell (21), the gas cartridge (90) is kept between the bottom portion of the shell (21) and the base plate (29). In fact, the bottom portion of the shell (21) is inclined, and as shown in FIG. 5, the bottom portion (201) gradually ascends from the front end to the rear end. Thus, there is a sufficient space for configuring the gas cartridge (90) between the rear end of the base plate (29) and the rear end of the bottom portion (201) of the shell (21); however, the present invention is not limited to the example above.

Figure 18:
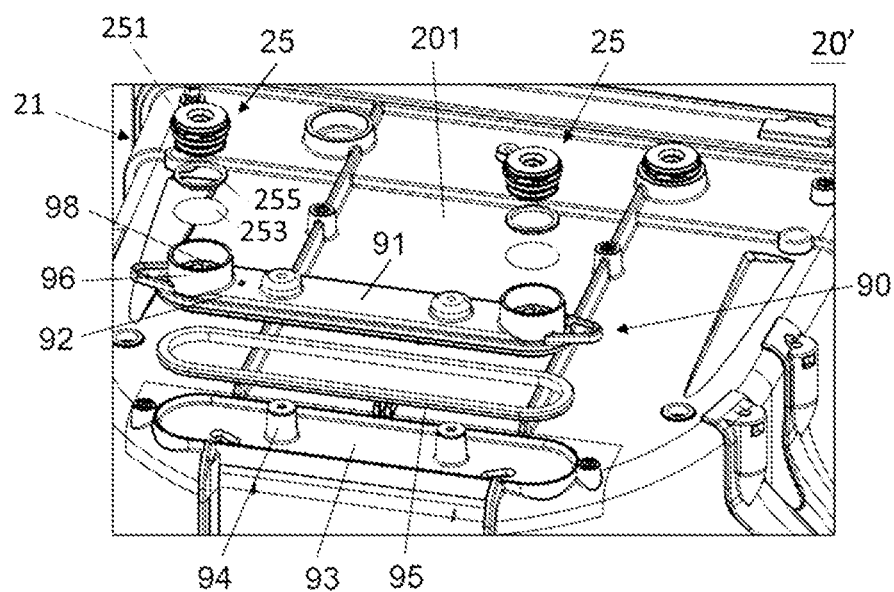
FIG. 18 is an exploded diagram of a gas cartridge of the present invention.
Figure 19:
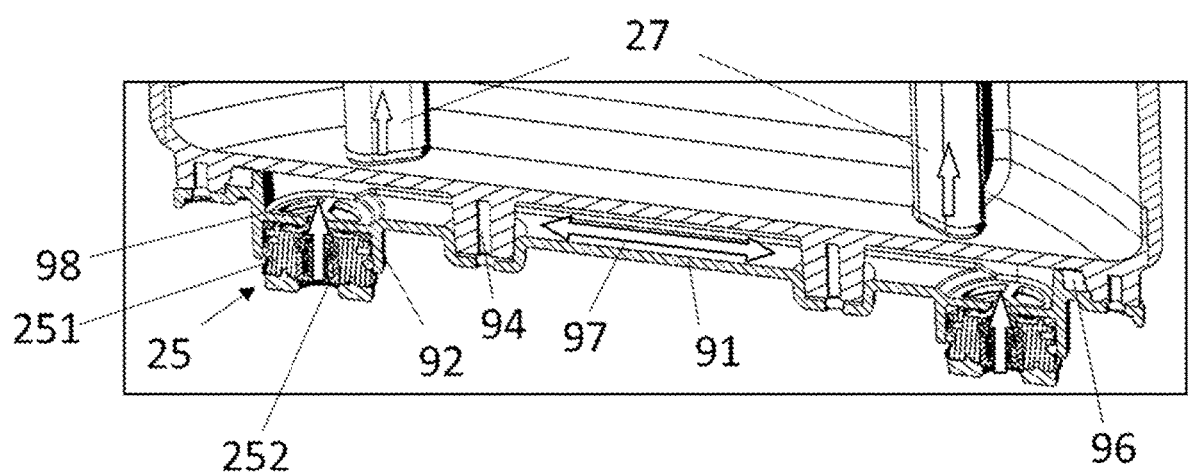
FIG. 19 is a section diagram of a gas cartridge configured at a wafer container of the present invention.
Figure 20:
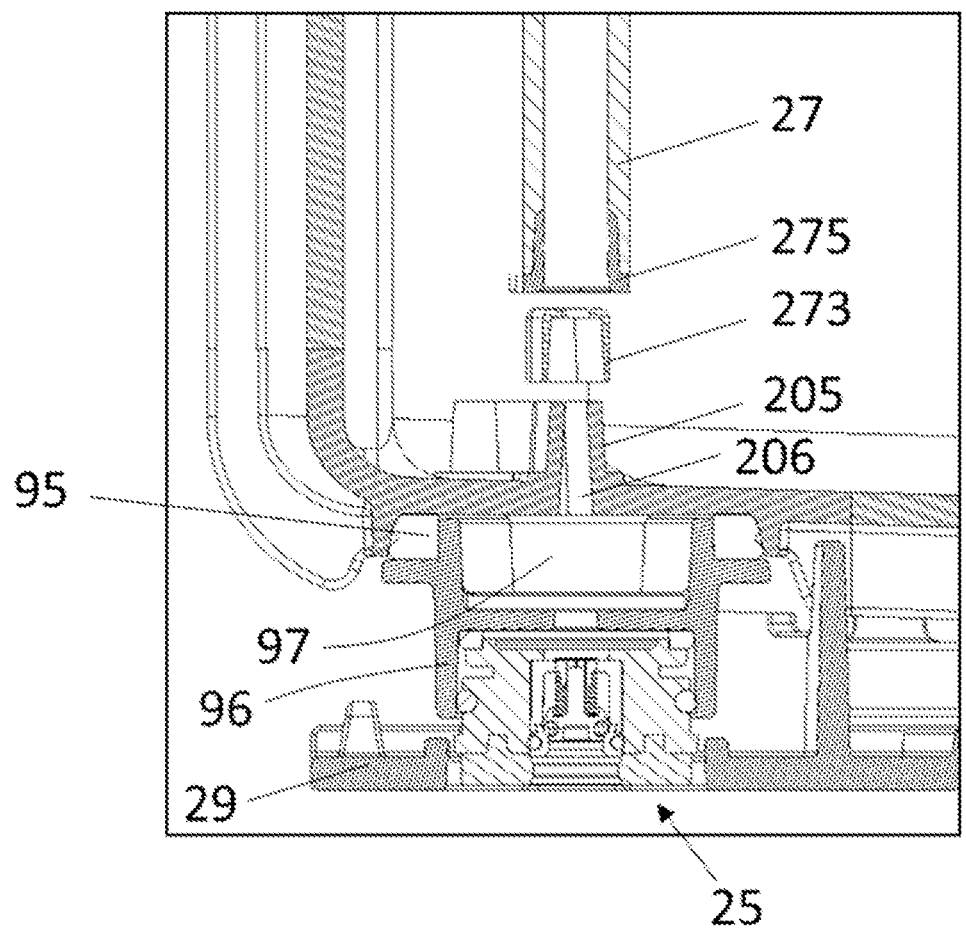
FIG. 20 is an enlarged partial section diagram of a gas cartridge configured at a wafer container of the present invention.

Referring to FIG. 18 and FIG. 19, FIG. 18 shows an exploded diagram of the gas cartridge (90) configured at the bottom portion (201) of the wafer container (20'). FIG. 19 shows a section diagram of the gas cartridge (90) configured at the wafer container (20') of the present invention. The gas cartridge (90) consists of a bottom portion (91), a sidewall (92) extending from the bottom portion (91) and the bottom portion (201) of the shell (21). The bottom portion (91) and the sidewall (92) are fundamentally formed an elongated narrow housing of the gas cartridge (90). An elongated narrow groove (93) is formed on an outer side surface of the bottom portion (201) of the shell (21), and is configured to accommodate the elongated narrow housing formed by the bottom portion (91) and the sidewall (92). The elongated narrow groove (93) and the elongated housing define a buffering gas chamber (97) in between. Refer to FIG. 20 showing an enlarged partial section diagram of the gas cartridge (90) configured at the wafer container (20') of the present invention. The coupling structure (205) and the through hole (206) thereof are formed on an inner side surface of the bottom portion (201) of the shell (21), wherein the coupling structure (205) is located on an opposite side surface of the elongated narrow groove (93). The elongated narrow groove (93) communicates with the accommodating space of the wafer container (20') via the through channel (206) of each coupling structure (205). One or more positioning mechanisms (94) may be further provided in the elongated narrow groove (93) to position the accommodated elongated narrow housing. An elongated narrow sealing ring (95) is provided between a contact surface between the sidewall (92) and the elongated narrow groove (93), so as to achieve an annular sealing function.

A plurality of annular sidewalls (96) further extend from the lower surface of the bottom portion (91) of the gas cartridge (90), and without changing the number and positions of nozzles on the applied load port used in coordination with the wafer container (20'), are implemented by a pair of annular sidewalls (96) as an example in this embodiment. Each annular sidewall (96) defines an installation space for filling by a gas intake module (25), wherein the installation space may be a cylindrical space so as to match the structural form of the gas intake module (25). A gas intake channel (98) is formed at the bottom portion (91) of the gas cartridge (90), and the gas intake channel (98) communicates with the installation space.

The gas intake module (25) includes the elastic sleeve (251), the check valve (252), the filter membrane (253) and the sealing ring (255). The sealing ring (255) may be provided between the gas intake module (25) and the annular sidewall (96) so as to achieve airtightness, thus preventing gas leakage of the gas cartridge (90). Moreover, the elongated narrow housing of the gas cartridge (90) may be fixed to the bottom portion (201) of the shell (21) by a known connection means, for example, screw connection or other connections in any forms, which are to be encompassed within the scope of protection of the present invention.

It is known from above that, the buffering gas chamber (97) is defined between the elongated narrow groove (93) and the elongated narrow housing, and the buffering gas chamber (97) has an elongated narrow space and thus covers the two gas intake channels (98) formed at the bottom portion (91) of the gas cartridge (90), providing a function of a common buffering space of the two gas intake channels. In this embodiment, the two gas intake channels are configured with two coupling structures (205) and two porous tubes (27) in corresponding numbers as an example. It should be noted that, the numbers may be designed and adjusted in response to actual requirements, and the present invention does not define the numbers configured for the implementation forms. The gas intake channel (98) of the buffering gas chamber (97) fluid communicates with a gas passage of the gas intake module (25), and each coupling structure (205) defines the through channel (206) having a center axis and fluid communicating with the porous tube (27). The through channel (206) allows a gas to enter the longitudinal space of the porous tube (27), and the gas eventually purges the accommodating space from the longitudinal space.

In continuation of the description above, the gas intake module (25) supplies the gas in one single gas intake direction that passes through the gas intake channel (98) and enters the buffering gas chamber (97), and the buffering gas chamber (97) is capable of balancing air pressures of the two gas intake modules (25). In other words, in case of a difference in the pressures of the incoming gas, the gas can be diffused in the elongated narrow space of the buffering gas chamber (97) to achieve a balanced air pressure. Thus, the buffering gas chamber (97) provides the gas with a balanced air pressure that travels from the through channel (206) of each coupling structure (205), passes through the porous tube (27) and enters the accommodating space of the wafer container (20'). At this point, the gas diffusion performance of the porous tube (27) is consistent. Therefore, the present invention also resolves the numerous problems of an uneven airflow entering the interior of the container or an insufficient total flow caused by a difference in the incoming air of a conventional diffuser.

Advantages of provided by the structural design of the present invention are further described below. The bottom end (that is, the open end) of the porous tube (27) may be mounted to the coupling structure (205) through a collar (273, that is, the second collar). Moreover, another collar (275, that is, the first collar) may be further provided in the open end of the porous tube (27). The materials of the collars (273, 275) are softer than the material of the porous tube (27). With the protection component including the two collars (273, 275), the porous tube (27) is prevented from breaking of the open end caused by overly large stress during sleeving, and airtightness between the porous tube (27) and the coupling structure (205) can be further enhanced. In addition to a combined type, the collar (275) may also be attached by means of sintering or bonding to the open end of the porous tube (27), so as to achieve the object of protecting the open end. Other components included in the gas intake module (25), the coupling structure (205), the porous tube (27), the collars (273, 275), the gas cartridge (90) and/or the wafer container (20') are made of one or more thermal resistant materials. Preferably, the thermal resistant material is selected from a group consisting of PEEK, HTPC, FKM, PPS, PPO, chlorinated polyether, POB, TORLON, EP, PF, PEI, PI, LCP, and a combination of at least two of the above.

Figure 21A:
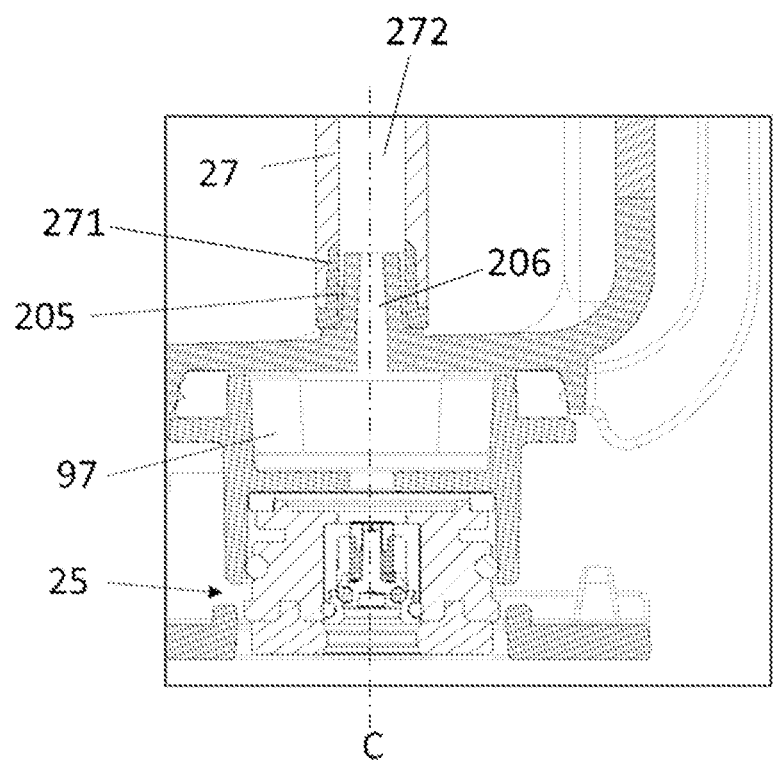
FIG. 21A to FIG. 21D are schematic diagrams of configurations of a porous tube and a gas cartridge according to some embodiments.

Other variation embodiments of the wafer container (20') of the second embodiment are further described below. Refer to FIG. 21A to FIG. 21D showing schematic diagrams of configurations of a porous tube and a gas cartridge according to some embodiments. FIG. 21A shows the gas intake direction is a same center axis (C). The coupling structure (205) is formed as extending from the bottom portion (201) of the wafer container (20'). The open end (271) of the longitudinal space (272) of the porous tube (27) has a center axis, and the longitudinal space (272) has a center axis. The center axis of the through channel (206), the center axis of the open end (271) of the porous tube (27), the center axis of the longitudinal space (272) of the porous tube (27) and the gas intake center axis of the gas intake module (25) are coaxial, and are presented as the center axis (C). The gas has gas intake direction directed straight through along the same center axis (C) into the longitudinal space (272) of the porous tube (27), and purges the accommodating space in the wafer container (20').

Figure 21B:
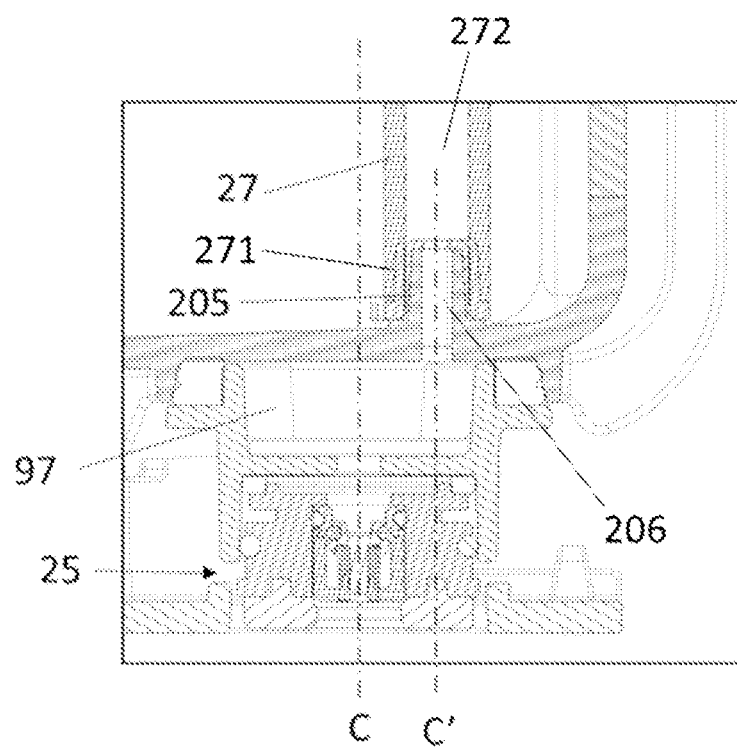

FIG. 21B shows the gas intake direction is not a same center axis. Two gas intake channels (98) are formed at the bottom portion (91) of the gas cartridge (90) to serve as the function of a common buffering space of the two gas intake channels. Thus, although the gas intake direction is not the same center axis, the technical feature of a straight-through gas intake direction is also achieved, and the problems of the increased flow time and poor fluency due to the winding during the traveling process of the gas are not resulted. The center axis of the through channel (206), the center axis of the open end (271) of the porous tube (27) and the center axis of the longitudinal space (272) of the porous tube (27) are coaxial, and are presented as the center axis (C'). The gas intake center axis of the gas intake module (25) is presented as the center axis (C). The position of the center axis (C) along which the gas passes through is offset from the center axis (C'). Although under the offset configuration, the gas from the gas intake module (25) does not follow a straight line to enter the longitudinal space (272). However, before entering the porous tube (27), the gas is already diffused in the buffering gas chamber (97) and forms a more stable pressure, and this ensures consistent gas diffusion performance of the each porous tube (27).

Figure 21C:
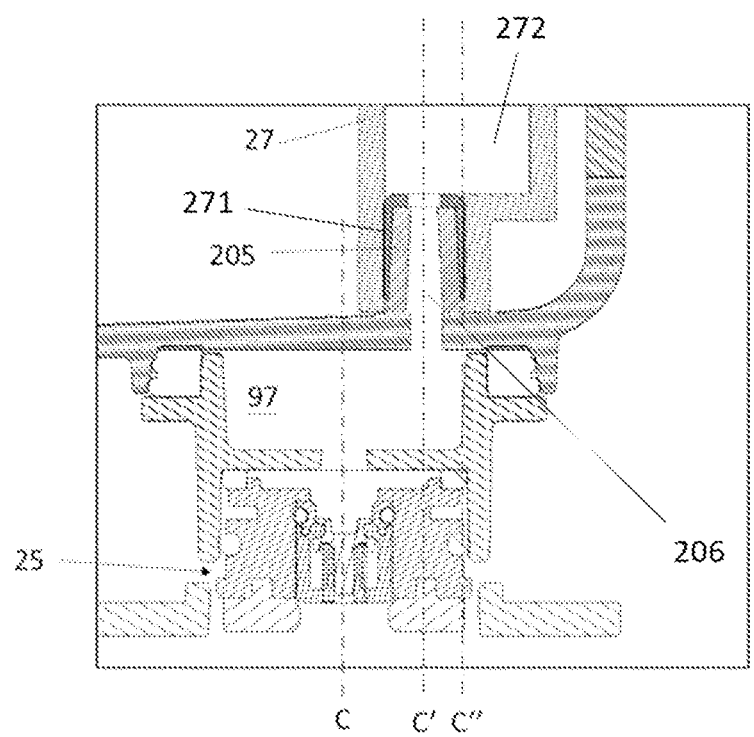

In another embodiment, the gas intake direction is not a same center axis, as shown in FIG. 21C. Along with the increased demand of the amount of diffused airflow, a porous tube (27) with an increased amount of airflow is designed by increasing the size of the porous tube (27), with the increased part extending toward the inner walls (203) of the shell (21). The gas intake center axis of the gas intake module (25) is presented as the center axis (C). The center axis of the through channel (206) and the center axis of the open end (271) of the porous tube (27) are coaxial, and are presented as the center axis (C'). The center axis of the longitudinal space (272) of the porous tube (27) is presented as the center axis (C"). The two gas intake channels (98) are formed at the bottom portion (91) of the gas cartridge (90) to serve as the function of a common buffering space of the two gas intake channels. Thus, although the center axis (C), the center axis (C') and the center axis (C") are all offset, the traveling path of the gas is not increased, and the amount of airflow can be increased to enhance purging performance.

Figure 21D:
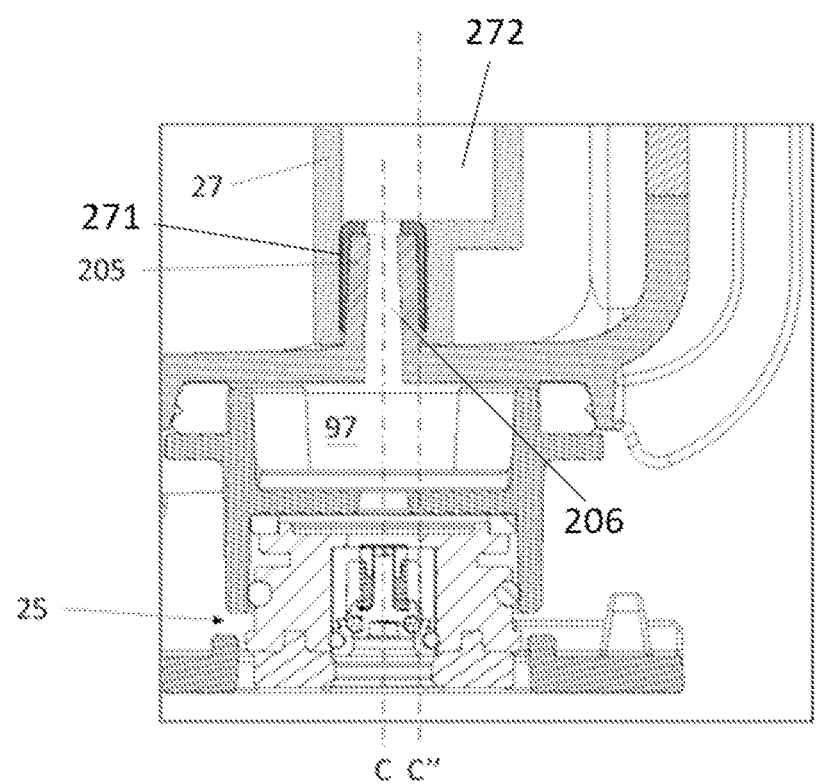

In another embodiment, the gas intake direction is not a same center axis. As shown in FIG. 21D, the size of the porous tube (27) is increased, and the increased part extends toward the inner walls (203) of the shell (21). The center axis of the through channel (206) and the center axis of the open end (271) of the porous tube (27) are coaxial, and are presented as the center axis (C). The center axis of the longitudinal space (272) of the porous tube (27) is presented as the center axis (C"), and the position of the center axis (C) along which the gas passes through is offset from the center axis (C"). Although under the offset configuration, before entering the longitudinal space (272) of the porous tube (27), the gas is already diffused in the buffering gas chamber (97) and forms a more stable pressure, and this ensures consistent gas diffusion performance of the each porous tube (27). Moreover, the amount of airflow is increased, so as to enhance the purge efficiency of the porous tube (27) with respect to the accommodating space in the wafer container (20').

Figure 22:
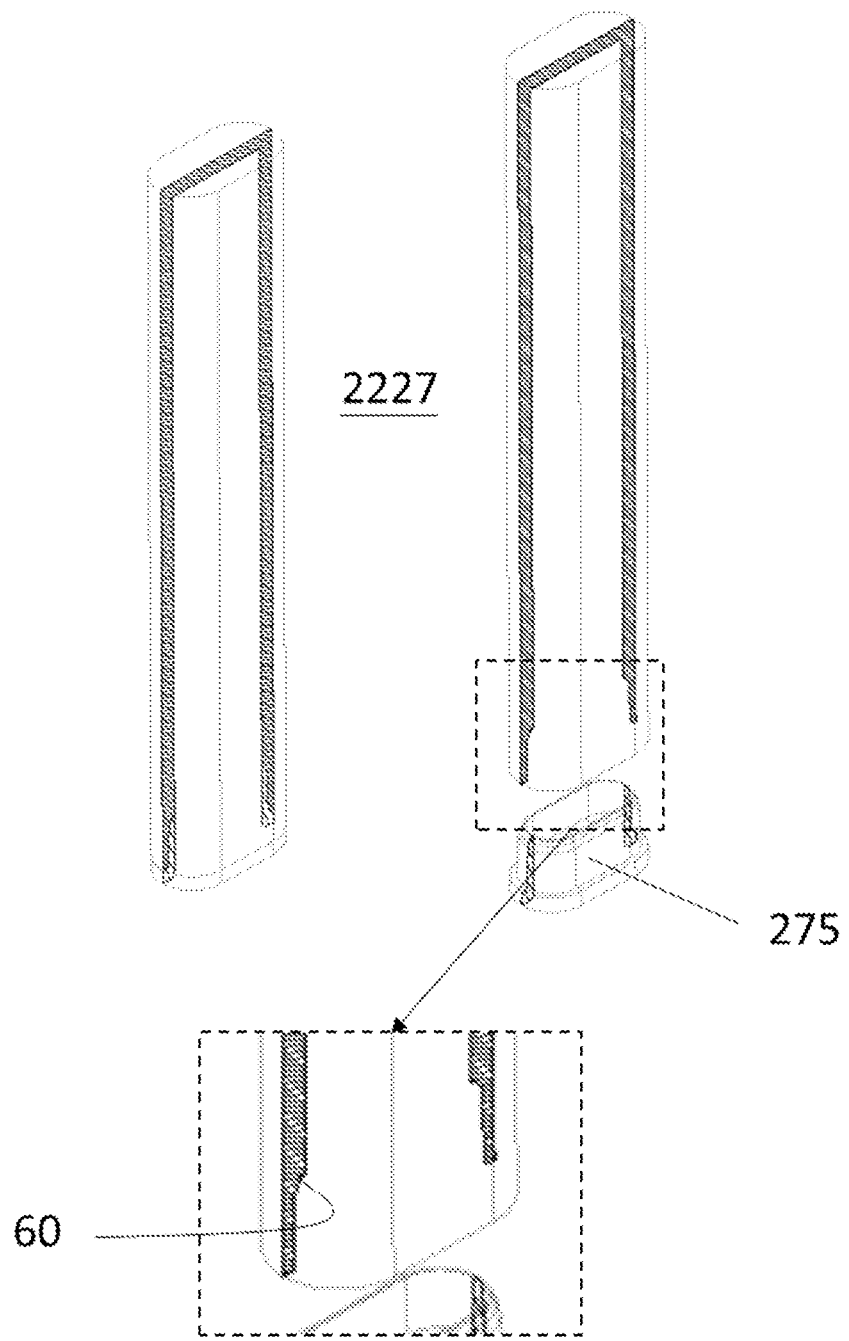
FIG. 22 shows a porous tube according to another embodiment of the present invention.

FIG. 22 shows a porous tube (2227) according to another embodiment of the present invention and the shape of a longitudinal cross section along a parallel long axis direction (Y). The open end of the porous tube (2227) is detachably connected to the collar (275), so as to adhere the collar (275) on an inner side of the open end. As shown in the longitudinal cross section in the drawing, the inner side of the open end is provided with a shoulder (60) configured to combine the collar (275). The hardness of the collar (275) may be lower than the hardness of the porous tube (2227), so as to protect the structure of the open end. The collar (275) may be tapered so as to easily enter the open end. Alternatively, the collar (275) may be adhered to the inner side of the open end by a specific means, such as heating and sintering. Thus, the reinforced open end can be mounted on the coupling structure (205) to prevent breaking of the open end.

Figure 23A:
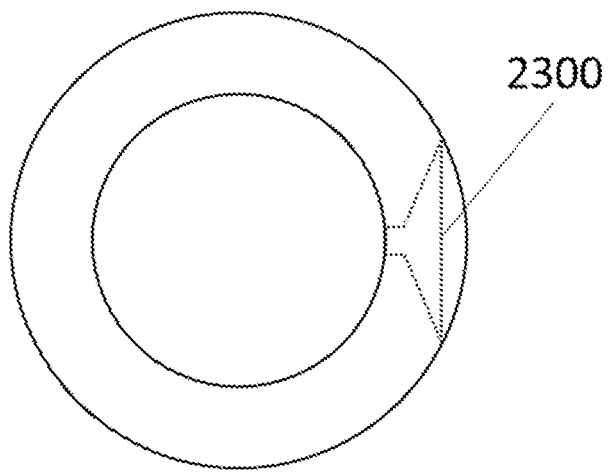
FIG. 23A and FIG. 23B show variation examples of slotted holes of a porous tube.
Figure 23B:
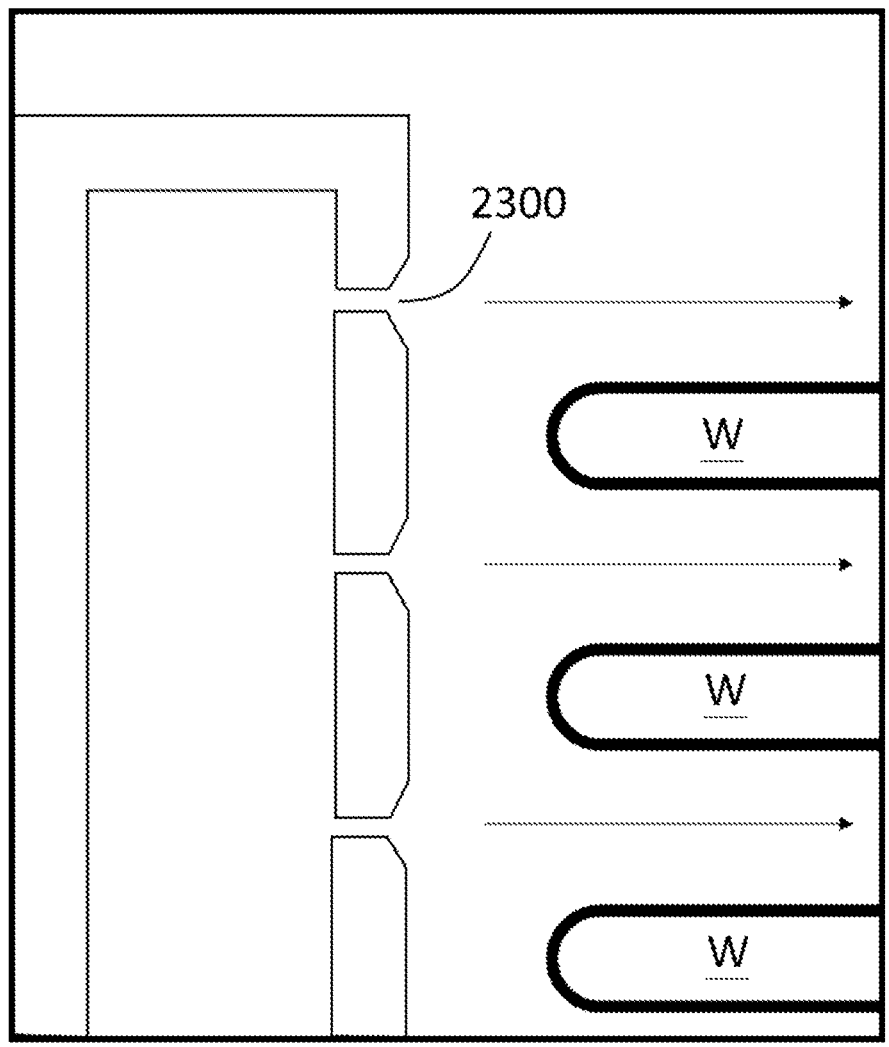

FIG. 23A and FIG. 23B show variation examples diffusion holes (slotted holes) of a porous tube. FIG. 23A shows that the longitudinal space of the porous tube has a horizontal cross section with a circular shape. The slotted hole (2300) is a space that diverges from the inside to the outside.

FIG. 23B shows that an outer side of each slotted hole (2300) has a tapered space, and the slotted holes (2300) are all arranged between top-and-down adjacent wafers (W), allowing the diffused airflow (as indicated by the arrows) to flow smoothly between the wafers.

Figure 24A:
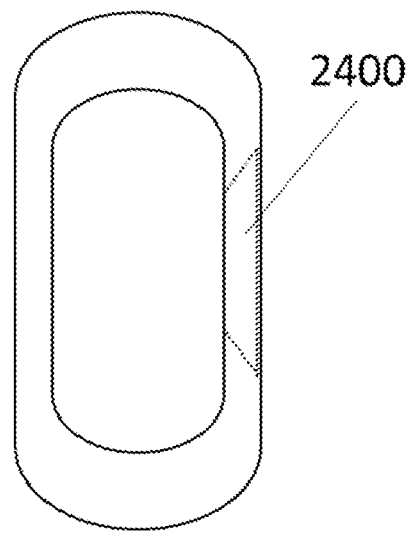
FIG. 24A and FIG. 24B show other variation example of slotted holes of a porous tube.
Figure 24B:
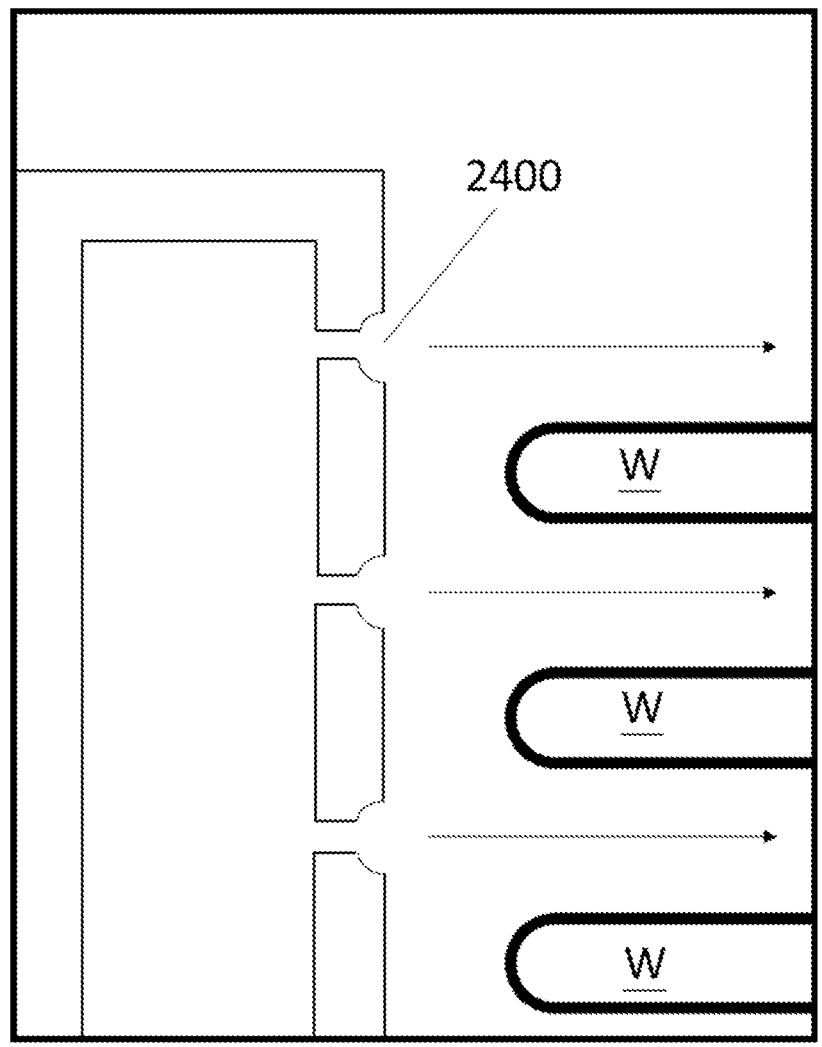

FIG. 24A and FIG. 24B show other variation examples of diffusion holes (slotted holes) of a porous tube. FIG. 24A shows that the longitudinal space of the porous tube has a horizontal cross section with an elongated narrow shape. The slotted hole (2400) is a space that diverges from the inside to the outside. FIG. 24B shows that an outer side of each slotted hole (2400) has a recessed space formed by a curved surface, and the slotted holes (2400) are all arranged between top-and-down adjacent wafers (W), allowing the diffused airflow (as indicated by the arrows) to flow smoothly between the wafers.

In conclusion of the above, in order to resolve the issues of a high temperature caused by fabrication processes during a carrying process of wafer in the prior art and hence a rise in the temperature of an interior space of a wafer container, such that performance of the overall wafer container and all components thereof are undesirably affected, the wafer container of the present invention and all the components thereof are made of thermal resistant materials; that is to say, all the elements disclosed by the present invention are to be encompassed within the scope of protection of the present invention.

Although certain details are used to describe the present invention as above for better understanding, it is to be understood that certain changes and modifications may be implemented within the scope of protection of the claims. Therefore, the embodiments above are intended for illustration purposes, and are not to be construed as limitations. Moreover, the present invention is not restrained by the details given in the description, and equivalent modifications made be made without departing from the field and spirit of the appended claims.

What is claimed is:

1. A gas diffusion device, installed in a wafer container having an accommodating space, the gas diffusion device comprising:
   a buffering gas chamber, configured at a bottom portion of the wafer container, the bottom portion provided with at least one coupling structure, the coupling structure defining a through channel having a center axis, the buffering gas chamber having at least one gas intake channel, the gas intake channel, the buffering gas chamber, the through channel and the accommodating space communicating with one another; and
   at least one porous tube, having a longitudinal space, the porous tube installed to the coupling structure of the wafer container, the longitudinal space of the porous tube communicating with the buffering gas chamber, the buffering gas chamber providing a gas to pass through the porous tube and enter the accommodating space, a gas intake center axis of the gas and a center axis of the coupling structure being coaxial.

2. The gas diffusion device according to claim 1, wherein the coupling structure is formed as extending from the bottom portion of the wafer container, an open end of the porous tube has a center axis, and the longitudinal space of the porous tube has a center axis; the center axis of the coupling structure, the center axis of the open end of the porous tube and the gas intake center axis are coaxial.

3. The gas diffusion device according to claim 1, wherein the coupling structure is formed as extending from the bottom portion of the wafer container, an open end of the porous tube has a center axis, and the longitudinal space of the porous tube has a center axis; the center axis of the coupling structure, the center axis of the open end of the porous tube and the gas intake center axis are coaxial; the center axis of the longitudinal space of the porous tube is offset from the center axis of the coupling structure, the center axis of the open end of the porous tube and the gas intake center axis.

4. The gas diffusion device according to claim 1, wherein the longitudinal space of the porous tube has a closed end and an open end, and the open end receives the corresponding coupling structure, so that the gas enters the longitudinal space by passing through the buffering gas chamber and the open end.

5. The gas diffusion device according to claim 1, wherein a shape of a horizontal cross section of the porous tube is an ellipsoid or an elongated narrow shape having a long axis and a short axis, or a circle having a diameter.

6. The gas diffusion device according to claim 5, further comprising:
   a first collar, arranged in the open end, the first collar located between the open end and the coupling structure.

7. The gas diffusion device according to claim 6, further comprising:
   a second collar, located between the first collar and the coupling structure when the second collar is disposed on the coupling structure so as to reinforce airtightness.

8. The gas diffusion device according to claim 6, wherein a material of the first collar is softer than a material of the porous tube to prevent breaking of the open end.

9. The gas diffusion device according to claim 7, wherein the second collar and the porous tube are sintered or bonded into an integral structure to prevent breaking of the open end.

10. The gas diffusion device according to claim 8, wherein the coupling structure, the porous tube, the first collar and/or the second collar are/is made of a thermal resistant material which is one or a combination of at least two selected from a group consisting of PEEK, HTPC, FKM, PPS, PPO, chlorinated polyether, POB, TORLON, EP, PF, PEI, PI and LCP.

11. The gas diffusion device according to claim 1, further comprising:
   an airflow guiding member, arranged adjacent to one side of the porous tube, the airflow guiding member configured to adjust an airflow direction of the gas entering the accommodating space.

12. The gas diffusion device according to claim 1, further comprising:
   at least one gas intake module, communicatively coupled to the buffering gas chamber, the gas intake module having the gas intake center axis, supplying the gas in one single gas intake direction to pass through the gas intake channel and enter the buffering gas chamber.

13. A gas diffusion device, installed in a wafer container having an accommodating space, the gas diffusion device comprising:
   a gas cartridge, configured at a bottom portion of the wafer container to define a buffering gas chamber, the bottom portion provided with at least two coupling structures, each of the coupling structures defining a through channel having a center axis, the buffering gas chamber having at least one gas intake channel, the gas intake channel, the buffering gas chamber, the through channel and the accommodating space communicating with one another; and at least two porous tubes, each of the porous tubes having a longitudinal space, the at least two porous tubes respectively installed to corresponding coupling structures of the wafer container, the longitudinal spaces of the two porous tubes communicating with the buffering gas chamber, the buffering gas chamber providing a gas to pass through the at least two porous tubes and enter the accommodating space.

14. The gas diffusion device according to claim 13, wherein the at least two coupling structures are formed as extending from the bottom portion of the wafer container, an open end of the longitudinal space of each of the porous tubes has a center axis, and the longitudinal space has a center axis; the center axis of each of the through channels, the center axis of the open end of each of the porous tubes, the center axis of the longitudinal space of each of the porous tubes and a gas intake center axis along which the gas passes are coaxial.

15. The gas diffusion device according to claim 13, wherein the at least two coupling structures are formed as extending from the bottom portion of the wafer container, an open end of each of the porous tubes has a center axis, and the longitudinal space of each of the porous tubes has a center axis; the center axis of each of the through channels, the center axis of the open end of each of the porous tubes and a gas intake center axis along which the gas passes are coaxial; the center axis of the longitudinal space of each of the porous tubes is offset from the center axis of the through channel, the center axis of the open end of the porous tube and the gas intake center axis.

16. The gas diffusion device according to claim 13, wherein the at least two coupling structures are formed as extending from the bottom portion of the wafer container, an open end of the longitudinal space of each of the porous tubes has a center axis, and the longitudinal space of each of the porous tube has a center axis; the center axis of each of the through channels, the center axis of the open end of each of the porous tubes, and the center axis of the longitudinal space of each of the porous tubes are coaxial; a position of a gas intake center axis along which the gas passes is offset from the center axis of the through channel, the center axis of the open end and the center axis of the longitudinal space that are coaxial.

17. The gas diffusion device according to claim 13, wherein the at least two coupling structures are formed as extending from the bottom portion of the wafer container, an open end of each of the porous tubes has a center axis, and the longitudinal space of each of the porous tubes has a center axis; the center axis of each of the through channels and the center axis of the open end of each of the porous tubes are coaxial; a gas intake center axis along which the gas passes and the center axis of the longitudinal space are both offset from the center axis of the through channel and the center axis of the open end that are coaxial.

18. The gas diffusion device according to claim 13, wherein the gas cartridge has a bottom portion and a sidewall extending from the bottom portion, and the gas intake channel is formed at the bottom portion of the gas cartridge.

19. The gas diffusion device according to claim 13, wherein the gas cartridge is installed at the bottom portion of the wafer container, such that a bottom portion and a sidewall of the gas cartridge and the bottom portion of the wafer container define the buffering gas chamber.

20. The gas diffusion device according to claim 13, wherein a plurality of annular sidewalls further extend from a lower surface of the bottom portion of the gas cartridge, each of the annular sidewalls defines an installation space for filling with a gas intake module, and the gas intake module has the gas intake center axis; the installation space, the gas intake channel at the bottom portion of the gas cartridge and the buffering gas chamber communicate with one another, such that the gas in one single air intake direction supplied by the gas intake module passes through the gas intake channel and enters the buffering gas chamber.

21. The gas diffusion device according to claim 13, wherein the wafer container comprises a base plate installed at the bottom portion of the wafer container, and the buffer gas chamber is between the bottom portion and the base plate of the wafer container.

22. The gas diffusion device according to claim 21, wherein the base plate is made of a material comprising a self-lubricating material.

23. A wafer container, comprising:
 a shell, comprising a bottom portion, the bottom portion configured with a plurality of coupling structures, the coupling structures defining a plurality of through channels;
 a buffering gas chamber, formed below the bottom portion, the buffering gas chamber having a plurality of gas intake channels, the gas intake channels communicating with the corresponding through channels; and
 a plurality of porous tubes, each of the porous tubes having an open end, the open end correspondingly connecting with the coupling structure at the bottom portion and communicating with the buffering gas chamber via the corresponding through channel, allowing a gas to pass through the porous tubes and enter an accommodating space of the shell.

24. The wafer container according to claim 23, wherein the porous tube has a longitudinal space, the longitudinal space has a closed end and an open end, and the gas in the buffering gas chamber is capable of passing through the open end to enter the longitudinal space.

25. The wafer container according to claim 23, further comprising:
 a collar, arranged between the open end and the coupling structure, a material of the collar being softer than a material of the porous tube to prevent breaking of the open end.

26. The wafer container according to claim 23, further comprising:
 a gas cartridge, having a bottom portion and a sidewall extending from the bottom portion, the bottom portion of the gas cartridge having the gas intake channels formed thereon.

27. The wafer container according to claim 26, wherein the gas cartridge is installed at the bottom portion of the shell, such that the gas cartridge and the bottom portion of the shell define the buffering gas chamber.

28. The wafer container according to claim 26, wherein a plurality of annular sidewalls further extend from the bottom portion of the gas cartridge, and each of the annular sidewalls defines an installation space for filling with a gas intake module.

29. The wafer container according to claim 23, wherein the wafer container further comprises a door detachably combined with the shell, and a pair of support portions configured on an inner side of the shell, and the wafer container is made of a thermal resistance material, which is one or a combination of at least two selected from a group consisting of PEEK, HTPC, FKM, PPS, PPO, chlorinated polyether, POB, TORLON, EP, PF, PEI, PI and LCP.

30. The wafer container according to claim 23, further comprising:
a base plate, connected below the shell to support the shell;
wherein the buffering gas chamber is between the bottom portion and the base plate of the shell.

31. The wafer container according to claim 30, wherein the base plate is made of a material comprising a self-lubricating material.

* * * * *